US006025794A

United States Patent [19]

Kusumoto et al.

[11] Patent Number: 6,025,794

[45] Date of Patent: Feb. 15, 2000

[54] SIGNAL TRANSMISSION CIRCUIT, SIGNAL TRANSMISSION METHOD A/D CONVERTER AND SOLID-STATE IMAGING ELEMENT

[75] Inventors: Keiichi Kusumoto, Nishinomiya; Akira Matsuzawa, Yawata; Kenji Murata, Katano; Youichi Okamoto, Hirakata, all of Japan

[73] Assignee: Matsushita Electric Industrial Co., Ltd., Kadoma, Japan

[21] Appl. No.: 08/792,769

[22] Filed: Feb. 3, 1997

[30] Foreign Application Priority Data

| | | | |
|---|---|---|---|
| Feb. 9, 1996 | [JP] | Japan | 8-023568 |
| May 7, 1996 | [JP] | Japan | 8-112459 |
| Nov. 5, 1996 | [JP] | Japan | 8-292936 |

[51] Int. Cl.[7] ..... H03M 1/12

[52] U.S. Cl. ..... 341/172; 341/155

[58] Field of Search ..... 341/118, 122, 341/172, 120, 155

[56] References Cited

U.S. PATENT DOCUMENTS

| | | | |
|---|---|---|---|
| 3,764,906 | 10/1973 | Heller | 324/111 |
| 4,138,666 | 2/1979 | Eichelberger et al. | 341/118 |
| 4,250,494 | 2/1981 | Butler et al. | 340/347 |
| 4,365,174 | 12/1982 | Kucharewski | 307/594 |
| 4,523,107 | 6/1985 | Peterson | 307/352 |
| 4,636,985 | 1/1987 | Aoki et al. | 365/189 |
| 4,783,621 | 11/1988 | Drefahl | 324/60 |
| 5,465,093 | 11/1995 | Kusumoto et al. | 341/122 |
| 5,617,093 | 4/1997 | Klein | 341/172 |
| 5,696,509 | 12/1997 | Maejima | 341/150 |

FOREIGN PATENT DOCUMENTS 1289381 11/1989 Japan .

*Primary Examiner*—Brian Young
*Assistant Examiner*—Peguy JeanPierre
*Attorney, Agent, or Firm*—Renner, Otto Boisselle, Sklar

[57] ABSTRACT

According to the present invention, a signal transmission circuit for receiving an input signal and outputting an output signal corresponding to the input signal is provided. The signal transmission circuit includes: a first capacitance; an electric charge supply section for supplying electric charge corresponding to the input signal to the first capacitance; a second capacitance; and a transfer section for transferring the electric charge from the first capacitance to the second capacitance. In the signal transmission circuit, the second capacitance is larger than the first capacitance.

9 Claims, 20 Drawing Sheets

2414
2415
248
249
243
Cf
CKT. TO BE DRIVEN
242
C0
C1
241
2416
244

Vin
Vrn
S1
S2
24
C1
S3
25
6
A
S6
28
C2
D
9
g
11
S7
S8
S9
S10
si1
si2
si3
si4
CS
j
15
S11
29
C3
30
l

Base clock
Switch 7
L0
L1
L2
L3
L4
L5
Period
Time
ON
OFF
1
2
3
4
5
6
7
8
9
10
11

(Transmission section)
Radio wave
2914
2911
2912
3116
3116
3117
A/D
A/D
A/D
Signal processor circuit
Transmitter circuit
3118
2910
Clock
3115
2913
3116
(Reception section)
Radio wave
3119
3121
3122
3122
3123
Receiver circuit
Signal processor circuit
D/A
D/A
D/A
Liquid crystal display
Clock
3120
3122

SIGNAL TRANSMISSION CIRCUIT, SIGNAL TRANSMISSION METHOD A/D CONVERTER AND SOLID-STATE IMAGING ELEMENT

BACKGROUND OF THE INVENTION

1. Field of the Invention

The present invention relates to: a signal transmission circuit and a signal transmission method for efficiently transmitting a signal by using a signal line having a parasitic capacitance; an A/D converter for converting an analog signal into a digital signal; and a solid-state imaging element for generating an output signal corresponding to an input image.

2. Description of the Related Art

An A/D converter is used for converting an analog signal into a digital signal. A/D converters have various circuit configurations which may be used such as, for example, a sequential-comparative type, a serial-parallel type and an all-parallel type. These circuit configurations, respectively, have advantages and disadvantages with respect to conversion speed, conversion precision and the power consumption thereof.

Of the above-mentioned three types of A/D converters, the all-parallel A/D converter exhibits the best conversion speed. The all-parallel circuit configuration is a basic configuration for an A/D converter implemented as an integrated circuit. However, the all-parallel circuit configuration has several disadvantages in that the conversion precision and the power consumption thereof are not sufficiently satisfactory.

In recent years, it has become more and more necessary to reduce the power to be consumed by portable electronic equipment. As a result, an A/D converter is increasingly required to consume as low power as possible. Thus, serial-parallel A/D converters are now used more frequently than the all-parallel A/D converters.

FIG. 23 is a block diagram showing a prior art serial-parallel A/D converter. A comparator 2310 receives an analog input signal An and then compares the signal Ain with a reference voltage bank Ref. The comparator 2310 outputs upper-bit digital values DU obtained as a result of the comparison to a D/A converter (DAC) 2330 and an operator circuit 2340. The DAC 2330 outputs a lower reference voltage bank RefL. The RefL is used as a reference for determining the lower bits based on the upper-bit digital values DU output from the comparator 2310. A comparator 2320 compares the analog input signal Ain with the lower reference voltage bank RefL, thereby outputting lower-bit digital values DL to the operator circuit 2340. The operator circuit 2340 produces and outputs an A/D converted output value Dout based on the upper-bit digital values DU and the lower-bit digital values DL.

In the A/D converter shown in FIG. 23, the digital signal DU output from the comparator 2310 is converted by the DAC 2330 into an analog signal RefL. The D/A conversion performed by the DAC 2330 decreases the conversion speed and increases the power consumption. Therefore, it is desirable to realize an A/D converter without performing such a D/A conversion. In other words, it is desirable for the comparator 2310 to output an analog signal directly to the comparator 2320.

Nevertheless, if an analog signal is transmitted, then a parasitic capacitance on a signal line leads to a decrease in operation speed and an increase in power consumption. A parasitic capacitance is caused on a signal line primarily because of a multitude of switches connected to the signal line and the length of the signal line. When a circuit is required to drive a signal line having a large parasitic capacitance, the driving ability and power consumption are required to be increased disadvantageously.

Consequently, transmitting an analog signal adversely decreases the operation speed of the system and increases the power consumption thereof due to the parasitic capacitance on the signal line. Similar problems are also caused in an A/D converter for converting an analog signal.

SUMMARY OF THE INVENTION

According to the present invention, a signal transmission circuit for receiving an input signal and outputting an output signal corresponding to the input signal is provided. The signal transmission circuit includes: a first capacitance; an electric charge supply section for supplying electric charge corresponding to the input signal to the first capacitance; a second capacitance; and transfer means for transferring the electric charge from the first capacitance to the second capacitance. In this signal transmission circuit, the second capacitance is larger than the first capacitance.

In one embodiment, the signal transmission circuit further includes conversion means for producing an output signal corresponding to the electric charge which has been transferred to the second capacitance.

In another embodiment, the first capacitance has a first terminal and a second terminal, the second capacitance has a first terminal and a second terminal, the transfer means is a switch for changing a connection state between the first terminal of the first capacitance and the first terminal of the second capacitance, and the second terminal of the first capacitance is connected to the second terminal of the second capacitance.

In still another embodiment, the electric charge supply section has a driver amp.

In still another embodiment, the electric charge supply section has a semiconductor device for generating electric charge upon an irradiation of light.

In still another embodiment, the conversion means has a variable capacitance.

According to another aspect of the present invention, an A/D converter for receiving an input voltage and outputting a digital signal corresponding to the input voltage is provided. The A/D converter includes: a first amplifier circuit for amplifying a voltage corresponding to a difference between the input voltage and a reference voltage; a holding capacitance for holding a voltage output from the first amplifier circuit; a second amplifier circuit for amplifying the voltage held in the holding capacitance; a parasitic capacitance caused by a wiring connecting the first amplifier circuit to the second amplifier circuit; a first switch provided between the first amplifier circuit and the holding capacitance; and a second switch provided between the holding capacitance and the parasitic capacitance. In this A/D converter, in a first state, the first switch is ON and the second switch is OFF, while in a second state, the first switch is OFF and the second switch is ON.

According to still another aspect of the present invention, a signal transmission method for receiving an input signal and outputting an output signal corresponding to the input signal is provided. The signal transmission method includes: an accumulation step of accumulating electric charge corresponding to the input signal in a first capacitance; and a transfer step of transferring the accumulated electric charge from the first capacitance to a second capacitance.

In one embodiment, the signal transmission method further includes a conversion step of producing an output signal corresponding to the electric charge which has been transferred to the second capacitance.

In another embodiment, the transfer step and the conversion step are performed simultaneously.

In still another embodiment, the conversion step uses an amplifier for amplifying a signal at an input terminal and outputting the amplified signal to an output terminal and a capacitance connected to the input terminal and the output terminal.

In still another embodiment, the conversion step uses a variable capacitance.

According to still another aspect of the present invention, a solid-state imaging element for receiving incident light and outputting an output signal corresponding to the incident light is provided. The solid-state imaging element includes: a first capacitance; an electric charge supply section for supplying electric charge corresponding to the incident light to the first capacitance; a second capacitance; and transfer means for transferring the electric charge from the first capacitance to the second capacitance. In the solid-state imaging element, the second capacitance is larger than the first capacitance.

In one embodiment, the electric charge supply section is a photodiode and the first capacitance is a parasitic capacitance of the photodiode.

In another embodiment, the solid-state imaging element further includes conversion means for producing an output signal corresponding to the electric charge which has been transferred to the second capacitance.

In still another embodiment, the conversion means includes an amplifier for amplifying a signal at an input terminal and outputting the amplified signal to an output terminal and a capacitance connected to the input terminal and the output terminal.

Thus, the invention described herein makes possible the advantage of providing a signal transmission circuit, a signal transmission method, an A/D converter and a solid-state imaging element for transmitting an analog signal through a signal line having a large parasitic capacitance with a small driving ability and at a higher speed.

This and other advantages of the present invention will become apparent to those skilled in the art upon reading and understanding the following detailed description with reference to the accompanying figures.

DESCRIPTION OF THE PREFERRED EMBODIMENTS

In the present specification, it is assumed that an expression "a switch is ON" refers to a state where the switch is closed. That is to say, when a switch is ON, current flows through the switch. Conversely, the expression "a switch is OFF" refers to a state where the switch is open. That is to say, when a switch is OFF, current does not flow through the switch.

Hereinafter, the embodiments of the present invention will be described with reference to the accompanying drawings.

EXAMPLE 1

First, the signal transmission circuit and the signal transmission method of the present invention will be described.

Figure 1:
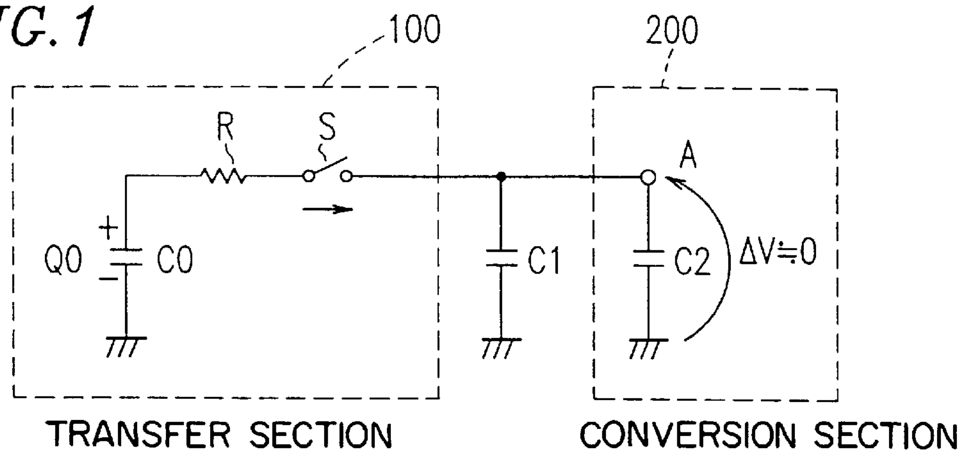
FIG. 1 is a diagram illustrating the principles of the signal transmission circuit and the signal transmission method in accordance with the present invention.

FIG. 1 is a diagram illustrating the principles of the signal transmission circuit and the signal transmission method in accordance with the present invention. The signal transmission circuit of the present invention includes a transfer section 100 and a conversion section 200. The transfer section 100 outputs electric charge (hereinafter, simply referred to as "charge") corresponding to an input signal to the conversion section 200. The conversion section 200 receives the charge so as to output a signal corresponding to the received charge.

A capacitor C1 corresponds to a stray capacitance caused by the wiring between the transfer section 100 and the conversion section 200, for example. However, the capacitor C1 is not limited to such a stray capacitance but may be any other capacitive load caused between the signal line connecting the transfer section 100 to the conversion section 200 and the ground. That is to say, the capacitor C1 may be a capacitance resulting from something other than a discrete component such as the stray capacitance of the wiring, the capacitance of an electronic switch connected to the transfer section 100 or a capacitance resulting from a discrete component such as a chip capacitor.

The transfer section 100 has a capacitor C0, a resistance R and a switch S which are connected in series to each other. When the switch S is OFF (or the switch S is open), charge Q0 is supplied to the capacitor C0 from an electric charge supply section (not shown). It is assumed that no charge is accumulated in the capacitors C1 and C2 and that a potential difference between the capacitors C1 and C2 is zero in an initial state when the switch S is OFF. When the charge Q0 is transferred to the conversion section 200, the switch S turns ON (i.e., the switch S is closed). The resistance R represents the resistance existing between the capacitor C0 and the capacitors C1 and C2, which is typically the resistance of the switch S.

When the switch S is turned from OFF to ON, the charge Q0 which has been accumulated in the capacitor C0 moves to the capacitors C1 and C2. When the switch S is ON, the potential difference between both terminals of the capacitor C1 and the potential difference between both terminals of the capacitor C2 are denoted by ΔV. Herein, a capacitance value (C1+C2) is assumed to be sufficiently larger than that of the capacitance C0. In such a case, the capacitance (C1+C2) appears to the capacitor C0 as if the former capacitance were a ground. In other words, the capacitor C0 can be regarded as having been short-circuited via the resistance R.

Figure 2:
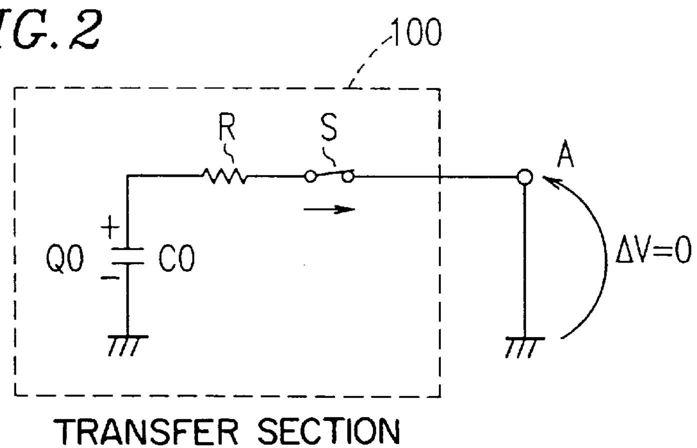
FIG. 2 is an equivalent circuit diagram of the circuit shown in FIG. 1 when (C1+C2)>>C0 is satisfied.

FIG. 2 is an equivalent circuit diagram of the circuit shown in FIG. 1 when (C1+C2)>>C0 is satisfied. In the circuit shown in FIG. 2, since the charge Q0 accumulated in the capacitor C0 is discharged via the resistance R, the time constant is equal to C0·R. In this case, the time constant C0·R is required to be small in order to realize a high-speed signal transmission. Herein, the resistance R is the resistance of a conventional switch S. Thus, it can be seen that the value of the capacitor C0 is required to be small so as to reduce the time constant C0·R. In accordance with the present invention, the time constant C0·R can be sufficiently reduced by setting the value of the capacitor C0 to be small.

That is to say, according to the present invention, when the relationship (C1+C2)>>C0 is satisfied, a signal can be transmitted at a high speed while consuming less power. In addition, if the value of the capacitor C0 is set to be small, even an input signal source having a low driving power can be advantageously connected to the signal transmission circuit of the present invention. Furthermore, if the charge accumulated in the capacitor C0 is transferred to the two capacitors C1 and C2 to be distributed therebetween, then no noise is generated, so that an S/N ratio can be improved as compared with a conventional signal transmission circuit.

FIG. 1 will be referred to again. When the switch S is ON, the charge Q0 accumulated in the capacitor C0 is distributed to the capacitors C1 and C2. In accordance with the above assumption, all the charge Q0 moves to the capacitors C1 and C2. Under this assumption, the voltage ΔV generated at the terminal A is substantially zero. The following Equations 1 and 2 are obtained with respect to the capacitors C1 and C2:

$$\Delta q1 = C1 \cdot \Delta V \quad (1)$$

$$\Delta q2 = C2 \cdot \Delta V \quad (2)$$

where Δq1 and Δq2 represent the charge accumulated in the capacitors C1 and C2, respectively.

If the voltage ΔV is eliminated from Equations 1 and 2, then the following Equation 3 is obtained:

$$\Delta q1 / \Delta q2 = C1 / C2 \quad (3)$$

As is clear from Equation 3, the ratio of the capacitance value of the capacitor C1 to that of the capacitor C2 is equal to the ratio of the charge Δq1 to the charge Δq2. Therefore, if the capacitance value of the capacitor C2 is sufficiently larger than that of the capacitor C1, then almost all of the charge Q0 is accumulated in the capacitor C2. This means that, in spite of the presence of the capacitor C1 (resulting from a stray capacitance, for example), the charge Q0 can be transferred from the capacitor C0 to the capacitor C2 without being affected by the capacitor C1 in accordance with the present invention. Thus, according to the present invention, the capacitance value of the capacitor C2 is preferably larger than that of the capacitor C1.

Next, the electric charge supply section of the signal transmission circuit and method according to the present invention will be described.

Figure 3:
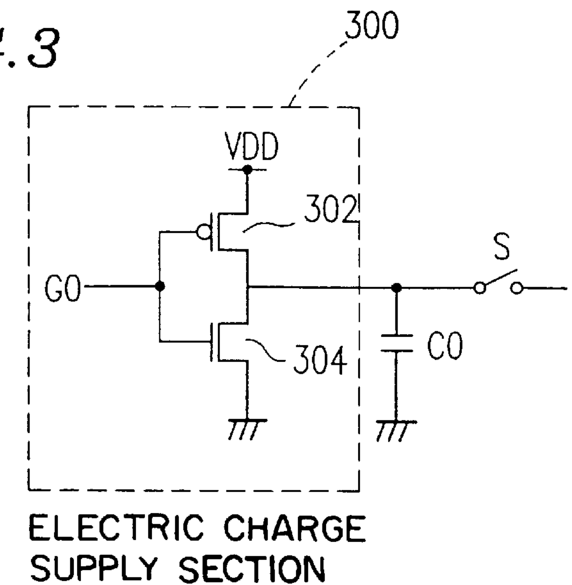
FIG. 3 is a circuit diagram showing an exemplary electric charge supply section for supplying electric charge Q0 to a capacitor C0.

FIG. 3 is a circuit diagram showing an exemplary electric charge supply section for supplying the charge Q0 to the capacitor C0. The electric charge supply section 300 includes a p-channel field effect transistor (FET) 302 and an n-channel FET 304 which are connected to each other in a complimentary manner. When the gates of the FETs 302 and 304 are set at H (a high level), charge is supplied from a power supply VDD to the capacitor C0. The circuit shown in FIG. 3 is an inverter formed of FETs. However, the electric charge supply section 300 may have a different configuration from that of the circuit shown in FIG. 3 so long as the section 300 functions as a driver amp. for controlling the charge supplied from the power supply and providing the charge to the capacitor C0.

Figure 4:
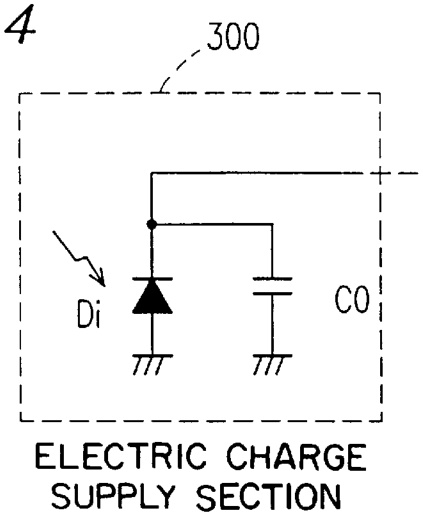
FIG. 4 is a circuit diagram showing an electric charge supply section using a diode.

FIG. 4 is a circuit diagram showing an electric charge supply section using a diode. The electric charge supply section 300 includes a diode Di. If the diode Di is inversely biased, a junction capacitance is formed in the diode Di. This junction capacitance may be used as the above-described capacitor C0. When light is irradiated onto the junction portion of the diode Di, charge is generated in the junction portion. This charge may be used as the charge Q0 shown in FIG. 1. Though the circuit shown in FIG. 4 uses a diode, any element other than a diode may also be used for the electric charge supply section 300 so long as the element is a semiconductor device for generating charge upon the irradiation of light.

Next, the conversion section 200 of the signal transmission circuit and method according to the present invention will be described.

Figure 5:
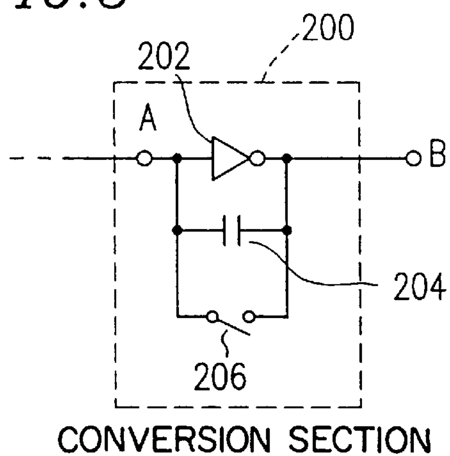
FIG. 5 is a circuit diagram showing an exemplary conversion section 200.

FIG. 5 is a circuit diagram showing an exemplary conversion section 200. The conversion section 200 shown in FIG. 5 includes: an inverter 202; a capacitor 204; and a switch 206. The inverter 202 has an amplification factor G. Herein, the amplification factor G is negative. That is to say, when an input voltage is denoted by Vi and an output voltage is denoted by Vo, then $Vo=G \cdot Vi$. The output voltage Vo has a phase inverse of the phase of the input voltage Vi. The input terminal and the output terminal of the inverter 202 are respectively connected to the two terminals of the capacitor 204. The capacitance of the capacitor 204 is C2*f*.

In the circuit shown in FIG. 5, an apparent capacitance viewed from the terminal A is $(-G+1) \cdot C2f$. This is because of the negative feedback operation performed by the inverter 202, as will be described later by using equations. Therefore, even when the capacitance C2*f* is small, the capacitance viewed from the terminal A becomes large, because the inverter 202 is connected in parallel to the capacitor 204. This capacitance $(-G+1) \cdot C2f$ corresponds to the capacitor C2 shown in FIG. 1. In the circuit shown in FIG. 5, the charge Q0 provided from the capacitor C0 is not only transferred to the capacitor 204, but also is amplified by the inverter 202 and then output to a terminal B. Thus, the voltage corresponding to the provided charge Q0 is output through the terminal B. When the circuit shown in FIG. 5 is operated, a step of transmitting a signal (or a step of transferring charge) and a step of reading out a signal are simultaneously performed, so that the time required for a signal transmission can be advantageously shortened.

Figure 6:
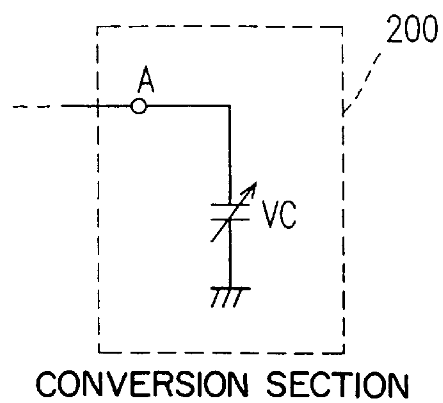
FIG. 6 is a circuit diagram of a conversion section 200 using a variable capacitor.

FIG. 6 is a circuit diagram of a conversion section 200 using a variable capacitor. The conversion section 200 includes a variable capacitor VC. The capacitance value of the variable capacitor VC can be varied by an external control. The terminal A not only receives the charge Q0 but also outputs a voltage corresponding to the charge Q0.

When the charge Q0 is transferred from the capacitor C0 to the capacitor VC, the value of the capacitor VC is set to be sufficiently larger than that of the capacitor C0. When the transferred charge Q0 is read out as an output voltage from the terminal A, the value of the capacitor VC is set to be small. The ratio of the value of capacitor VC to that of the capacitor C0 is changed from a large value into a small value once the charge has been transferred. As a result, the voltage at the terminal A also becomes high (i.e., the potential difference between both terminals of the capacitor VC becomes large). Thus, according to the present invention, the voltage corresponding to the charge Q0 or an output signal can be conveniently read out to an external circuit. It is noted that a step of transmitting a signal (or a step of transferring charge) and a step of reading out a signal are sequentially performed for operating the circuit shown in FIG. 6. The circuit shown in FIG. 6 provides an advantage of boosting the voltage corresponding to the transferred charge without degrading an S/N ratio.

EXAMPLE 2

Figure 7:
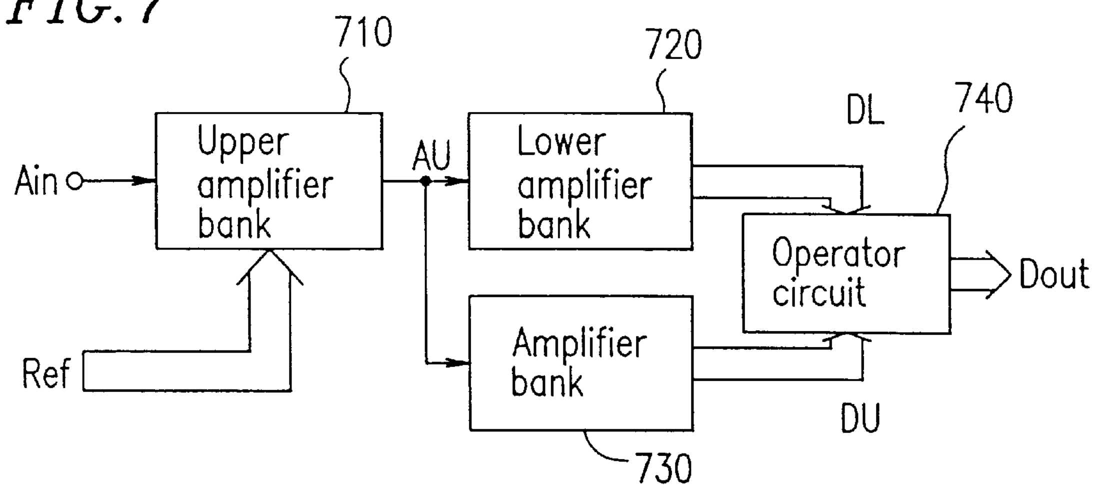
FIG. 7 is a block diagram of the A/D converter according to the present invention.

FIG. 7 is a block diagram of the A/D converter according to the present invention. An upper amplifier bank 710 receives an analog input signal Ain and a plurality of reference voltages Ref, amplifies the difference between the analog input signal Ain and the reference voltages Ref and then outputs the differential voltage AU. A lower amplifier bank 720 selects only the reference voltages in the vicinity of the voltage of the analog input signal Ain from the plurality of reference voltages Ref and interpolates the selected reference voltages, thereby outputting lower-bit data DL. An amplifier bank 730 outputs upper-bit data DU indicating which of the plurality of divisions defined by the plurality of reference voltages Ref the analog input signal Ain belongs to. An operator circuit 740 combines the data DU with the data DL and outputs finally converted digital data Dout corresponding to the voltage of the input analog signal Ain.

As shown in FIG. 7, unlike the prior art A/D converter, the A/D converter of the present invention has no D/A conversion section. As a result, the power which has conventionally been consumed by the D/A conversion section can be saved. Also, if the A/D converter of the present invention is integrated, the chip size can be reduced because the D/A conversion section typically occupies a large area on the chip.

Figure 8:
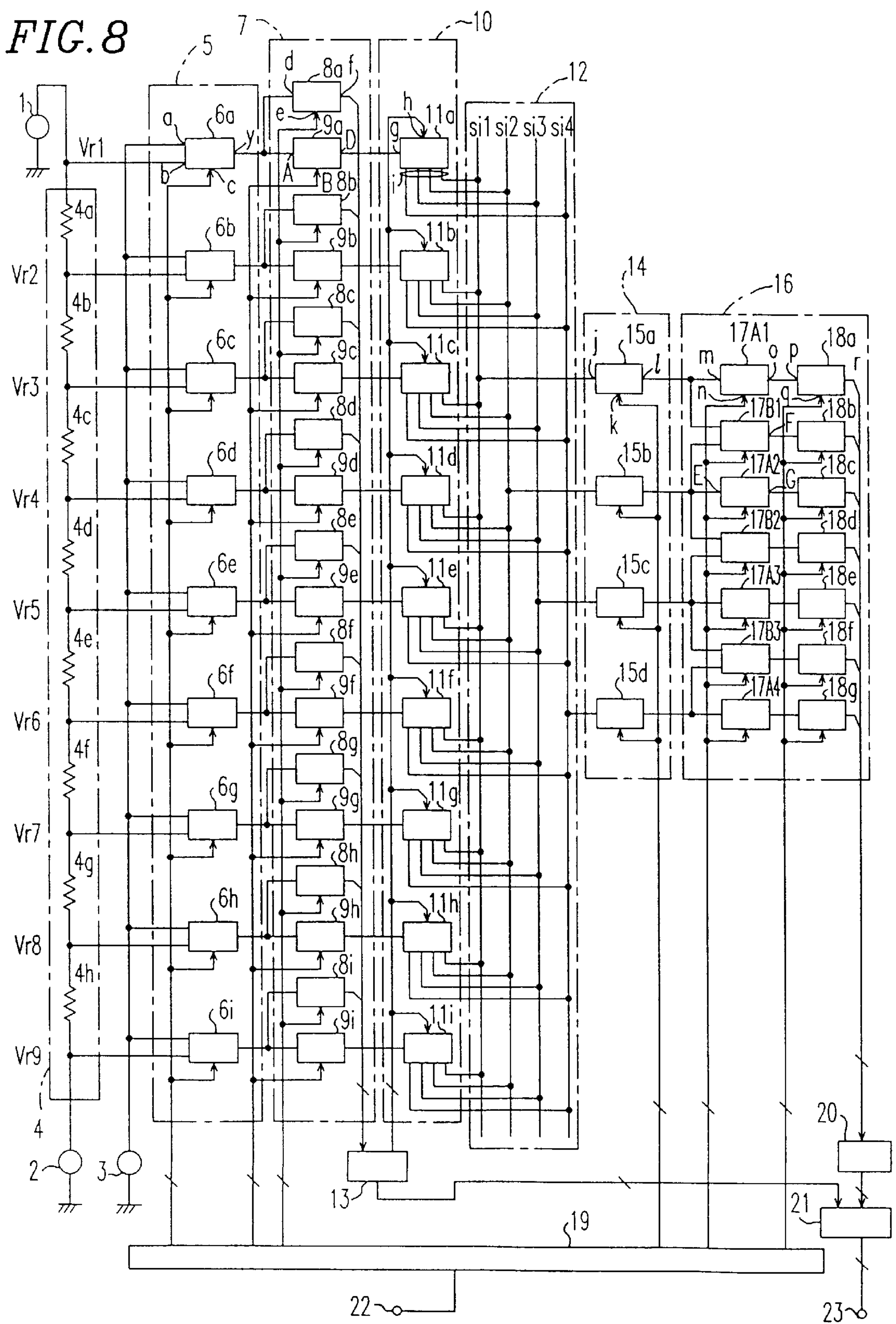
FIG. 8 is a circuit diagram of the A/D converter according to the present invention.

FIG. 8 is a circuit diagram of the A/D converter according to the present invention. In FIG. 8, the components identified by the same reference numeral (each including a different alphabetical letter (a, b, c, . . . ) added to the end of the numeral) have the same circuit configuration. For example, all of the first amplifier circuits 6*a* to 6*i* included in a first amplifier circuit bank 5 have the same circuit configuration. It is noted that a collection of a plurality of components having the same configuration generally will be referred to as if such components were a single component with no alphabetical letter added to the end. For example, a collection of the first amplifier circuits 6*a* to 6*i* is generally termed a "first amplifier circuit 6".

Moreover, in FIG. 8, the reference letters (each of which is represented by one alphabetical letter) of the terminals, which each of a plurality of circuit components having the same circuit configuration has, are attached only to the representative ones for the sake of simplicity. For example, each of the first amplifier circuits 6*a* to 6*i* has terminals a, b, c and y. However, in FIG. 8, these reference letters are attached only to the first amplifier circuit 6*a*, not to the other first amplifiers 6*b* to 6*i*.

A constant voltage source 1 and a constant voltage source 2 respectively apply a voltage Vr1 and a voltage Vr9 to both ends of a resistance bank 4. In the present specification, the term "voltage" without any modifier means a potential from ground. The resistance bank 4 is a resistance bank for equally dividing a voltage between the voltage Vr1 applied from the constant voltage source 1 and the voltage Vr9 applied from the constant voltage source 2 and includes resistances 4*a* to 4*h*. It is noted that the number of the resistances included in the bank 4 is not limited to eight. Also, in this case, the voltage between the voltages Vr1 and Vr9 is equally divided. However, the voltage is not necessarily equally divided.

An analog signal source 3 supplies an input voltage Vin to the A/D converter. The A/D converter receives the voltage Vin as an input signal and applies an A/D conversion to the voltage, thereby outputting a digital value corresponding to the voltage Vin as an output signal.

The first amplifier bank 5 includes first amplifier circuits 6*a* to 6*i*. Each of the first amplifier circuits 6*a* to 6*i* samples the input voltage Vi, amplifies a differential voltage between the sampled voltage Vin and a corresponding reference voltage Vr1, Vr2, Vr3, Vr4, Vr5, Vr6, Vr7, Vr8 or Vr9 and then outputs the amplified differential voltage.

A latch and intermediate holding circuit bank 7 includes first latch circuits 8*a* to 8*i* and intermediate holding circuits 9*a* to 9*i*. Each of the first latch circuits 8*a* to 8*i* amplifies the output signal of a corresponding first amplifier circuit 6*a*, 6*b*, 6*c*, 6*d*, 6*e*, 6*f*, 6*g*, 6*h* or 6*i*, thereby outputting a digital signal. In this digital signal, a power supply voltage VDD (e.g., 3.3 V) is defined as an H (high) level, and a ground level VSS (e.g., 0 V) is defined as an L (low) level. Each of the intermediate holding circuits 9*a* to 9*i* receives and holds the output signal of a corresponding first amplifier circuit 6*a*, 6*b*, 6*c*, 6*d*, 6*e*, 6*f*, 6*g*, 6*h* or 6*i*. The first latch circuit 8 outputs data indicating to which of the eight voltage divisions Vr1 to Vr2, Vr2 to Vr3, Vr3 to Vr4, Vr4 to Vr5, Vr5 to Vr6, Vr6to Vr7, Vr7 to Vr8 and Vr8 to Vr9 the input voltage Vin belongs to the upper-bit data processor circuit 13.

A demultiplexer bank 10 includes demultiplexer 11*a* to 11*i*. Each of the demultiplexers 11*a* to 11*i* receives the output of a corresponding intermediate holding circuit 9*a*, 9*b*, 9*c*, 9*d*, 9*e*, 9*f*, 9*g*, 9*h* or 9*i* and selectively outputs the received output to one of signal lines si1 to si4.

A signal line bus 12 includes signal lines si1 to si4. The signal lines si1 to si4 transmit the signals output from the intermediate holding circuits 9*a* to 9*i* to the second amplifier circuits 15*a* to 15*d*, respectively.

The upper-bit data processor circuit 13 receives the digital signals output from the latch circuits 8*a* to 8*i*, encodes the digital signals into upper-bit digital values and then outputs the encoded values. Herein, an "upper-bit digital value" is a value represented by the upper bits of a finally obtained digital value corresponding to an input signal. In this embodiment, since an upper-bit digital value represents one of the eight voltage divisions, the upper-bit digital value has 3-bit information.

Also, the upper-bit data processor circuit 13 outputs to the demultiplexers 11*a* to 11*i* signals for controlling the operation thereof. More specifically, when an input voltage is located within a division between the voltages Vr3 and Vr4, for example, the upper-bit data processor circuit 13 controls the demultiplexers 11*a* to 11*i* such that signals corresponding to the voltages Vr2, Vr3, Vr4 and Vr5 are output from the intermediate holding circuits 9*b*, 9*c*, 9*d* and 9*e* to the signal lines si1, si2, si3 and si4, respectively.

A second amplifier circuit bank 14 includes second amplifier circuits 15*a* to 15*d*. The second amplifier circuits 15*a* to 15*d* are respectively connected to the signal lines si1 to si4 and amplify and output the four signals output from four out of the nine demultiplexers 11*a* to 11*i*.

An interpolator circuit 16 includes third amplifier circuits 17A1 to 17A4 and third amplifier circuits 17B1 to 17B3. The third amplifier circuits 17A1 to 17A4 amplify and output the voltages output from the second amplifier circuits 15*a* to 15*d*, respectively. Each of the third amplifier circuits 17B1 to 17B3 interpolates the output voltage of an adjacent second amplifier circuit 15*a*, 15*b*, 15*c* or 15*d*.

Second latch circuits 18*a* to 18*g* respectively amplify the output signals of the third amplifier circuits 17A1 to 17A4 and 17B1 to 17B3, thereby outputting digital signals. In the same way as the operation of the first latch circuits 8*a* to 8*i*, the power supply voltage VDD is defined as the H level and the ground level VSS is defined as the L level in this digital signal, too. For example, when an input voltage is located between the voltages Vr3 and Vr4, the interpolator circuit 16 performs an interpolation between Vr2 and Vr3, between Vr3 and Vr4 and between Vr4 and Vr5, respectively. When the voltage of an input signal is located between the voltages Vr2 and Vr3, the interpolator circuit 16 outputs "+1" as the least significant bit (i.e., a so-called "carry bit") of the upper-bit digital value. Conversely, when the voltage of an input signal is located between the voltages Vr3 and Vr4, the interpolator circuit 16 outputs "−1" as the least significant bit (i.e., a so-called "carry bit") of the upper-bit digital value. In the interpolator circuit, a n interpolation for obtaining an intermediate point of the output voltages from the second amplifier circuits 15 is performed, as will be described later. Thus, a lower-bit digital value has one-bit information except for the carry bit described above.

A clock generator circuit 19 outputs a clock to latch circuits, demultiplexers and the like, thereby synchronizing the operation of the entire circuit. A lower-bit data processor circuit 20 receives a digital signal output from the interpolator circuit 16 and then converts the signal into a lower-bit digital value. An operator circuit 21 receives the upper-bit data output from the upper-bit data processor circuit 13 and the lower-bit data output from the lower-bit data processor circuit 20 and performs a process for combining these data, thereby outputting a finally (or all-bit) A/D converted digital value. Through a clock input terminal 22, a clock having a frequency coinciding with the conversion frequency is received and output to the clock generator circuit 19. Through an output terminal 23, a finally A/D converted value is output.

Hereinafter, the operation of the A/D converter of the present invention will be described with reference to more detailed circuit diagrams and FIG. 8.

Figure 9:
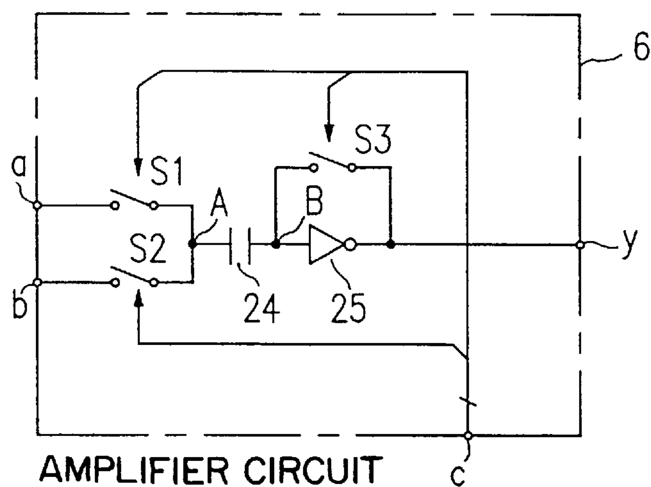
FIG. 9 is a circuit diagram of a first amplifier circuit 6.

FIG. 9 is a circuit diagram of the first amplifier circuit 6. An analog signal having a voltage Vin is received through a terminal a. A reference voltage Vrn (where n=1, 2, 3, . . . 9) is received from the resistance bank 4 through a terminal b. Switches S1 to S3 are turned ON/OFF at the respective timings to be described later, thereby setting the operation state of the first amplifier circuit 6 to be either a sampling state or an amplification state. Signals controlling the ON/OFF states of the switches S1 to S3 are received through a terminal c. A signal which has been sampled and amplified by the first amplifier circuit 6 is output through a terminal y. A sampling capacitor 24 performs a sampling operation by charging the voltage of the input analog signal. An inverting amplifier 25 amplifies a differential voltage of the analog signals input to the terminals a and b and then outputs the amplified voltage.

Figure 10:
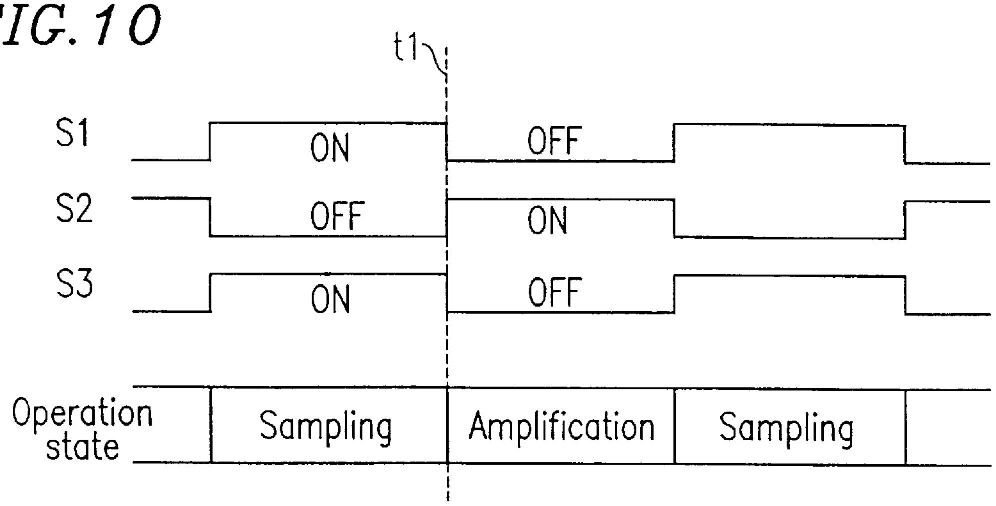
FIG. 10 is a chart illustrating the ON/OFF states of switches S1 to S3 and the operation states (sampling and amplification) of the first amplifier circuit 6.

FIG. 10 is a chart illustrating the ON/OFF states of the switches S1 to S3 and the operation states (sampling and amplification) of the first amplifier circuit 6. During a sampling period, the switches S1 and S3 are ON, while the switch S2 is OFF. When the capacitance value of the sampling capacitor 24 is denoted by C1, the charge Q1 which has been accumulated in the sampling capacitor 24 is given by the following Equation 4:

$$Q1=C1\cdot(Vin-Va) \quad (4)$$

where the voltage Vin is an instantaneous value of the voltage of an analog signal input to the terminal a when the switch S1 is turned from ON into OFF (or an instantaneous value of the analog signal at a time t1 shown in FIG. 10), and the voltage Va is a voltage at the input terminal (i.e., the terminal B) and the output terminal of the inverting amplifier 25 while the switch S3 is ON.

In the amplification state, the switches S1 and S3 are OFF and the switch S2 is ON. In this state, a reference voltage Vrn (where n=1, 2, 3, . . . 9) is provided from the resistance bank 4 to the terminal b. While the switch S3 is OFF, the terminal B is in an open state and the charge Q1 accumulated in the capacitor 24 during the sampling period is held. Thus, the following Equation 5 is obtained with respect to the voltage VB at the terminal B:

$$Q1=C1\cdot(Vrn-VB) \quad (5)$$

If Q1 and C1 are eliminated by combining Equations 4 and 5, the voltage VB is represented as follows in Equation 6:

$$VB=Vrn-Vin+Va \quad (6)$$

As is clear from Equation 6, the voltage VB has been shifted by a voltage (Vrn−Vin) from the voltage Va at the terminal B while the switch S3 is ON.

The inverting amplifier 25 is assumed to have a voltage gain (−G) (G>>0) when the input voltage thereof is in the vicinity of the voltage Va. Then, the output voltage Vol of the first amplifier circuit 6 is given by the following Equation 7:

$$Vol=-G\cdot(Vrn-Vin)+Va \quad (7)$$

As represented by Equation 7, the output voltage Vol of the first amplifier circuit 6 is obtained by amplifying a differential voltage between the voltage Vin of the analog signal and the reference voltage Vrn by the gain (−G) and then shifting the amplified differential voltage by the voltage Va.

Figure 11:
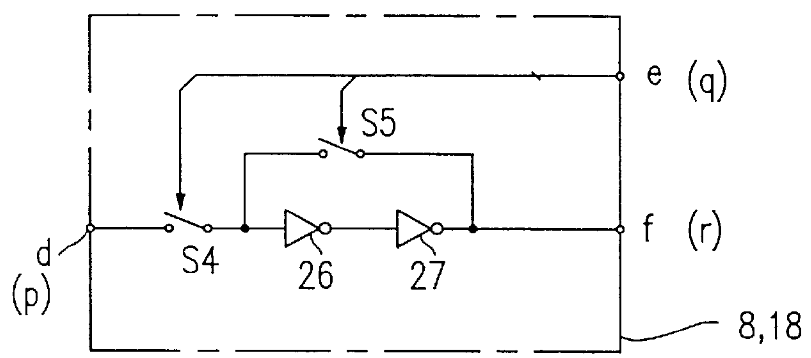
FIG. 11 is a circuit diagram of a first latch circuit 8 and a second latch circuit 18.

FIG. 11 is a circuit diagram of the first latch circuit 8 and the second latch circuit 18. Since the first latch circuit 8 and the second latch circuit 18 have the same configuration, only the first latch circuit 8 will be explained in the following description. The second latch circuit 18 functions similarly to the first latch circuit 8. In the following description, a reference numeral shown in parentheses immediately subsequent to a reference numeral of the first latch circuit 8 denotes a corresponding terminal of the second latch circuit 18.

A signal output through the output terminal y of the first amplifier circuit 6 is received through a terminal d (terminal p). A signal output from the output terminal of an inverting amplifier 26 is received through the input terminal of an inverting amplifier 27. That is to say, the inverting amplifiers 26 and 27 are connected in series, thereby forming a non-inverting amplifier. A signal amplified by the serially connected inverting amplifiers 26 and 27 is output through a terminal f (a terminal r). Switches S4 and S5 are turned ON/OFF at the respective timings to be described later, thereby setting the operation state of the first latch circuit 8 and the second latch circuit 18 to be either a latch state or a through state. Signals controlling the ON/OFF states of the switches S4 and S5 are received through a terminal e (a terminal q).

Figure 12:
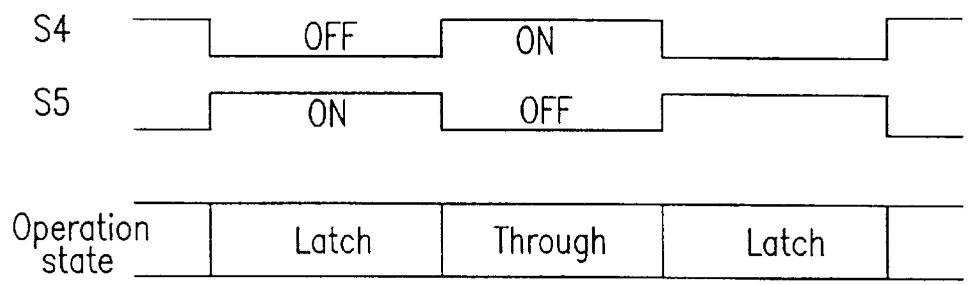
FIG. 12 is a chart illustrating the ON/OFF states of switches S4 and S5 and the operation states (latch and through) of the first latch circuit 8 and the second latch circuit 18.

FIG. 12 is a chart illustrating the ON/OFF states of the switches S4 and S5 and the operation states (latch and through) of the first latch circuit 8 and the second latch circuit 18. During a latch period, the switch S4 is OFF and the switch S5 is ON. In this case, the input terminal of the non-inverting amplifier formed of the inverting amplifiers 26 and 27 or the input terminal of the inverting amplifier 26 is connected to the output terminal thereof or the output terminal of the inverting amplifier 27. The input terminal of the non-inverting amplifier is electrically isolated from the terminal d. As a result, the input digital value is held by the first latch circuit 8.

During a through period, the switch S4 is ON and the switch S5 is OFF. In this case, the inverting amplifier receives the signal input through the terminal d, amplifies the received signal and then outputs the amplified signal to the inverting amplifier 27. The inverting amplifier 27 further amplifies the signal output from the inverting amplifier 26 and then outputs the amplified signal through the terminal f. The signal input through the terminal d is amplified by the inverting amplifiers 26 and 27 so as to be converted into a digital signal. In this digital signal, the power supply voltage VDD is defined as the H level and the ground level VSS is defined as the L level.

Figure 13:
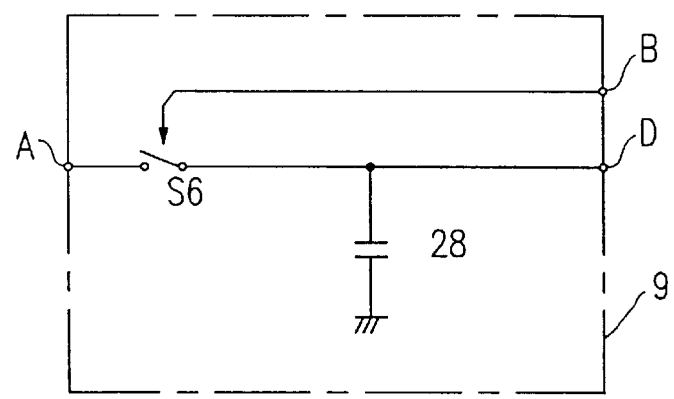
FIG. 13 is a circuit diagram of an intermediate holding circuit 9.

FIG. 13 is a circuit diagram of the intermediate holding circuit 9. A signal from the output terminal y of the first amplifier circuit 6 is received through a terminal A. A holding capacitor 28 holds the voltage of the signal input through the terminal A. A switch S6 is turned ON/OFF at the respective timings to be described later, thereby setting the operation state of the intermediate holding circuit 9 to be either a charge state or a transfer state. Signals controlling the ON/OFF states of the switch S6 are received through a terminal B. A signal having the held voltage is output through a terminal D.

Figure 14:
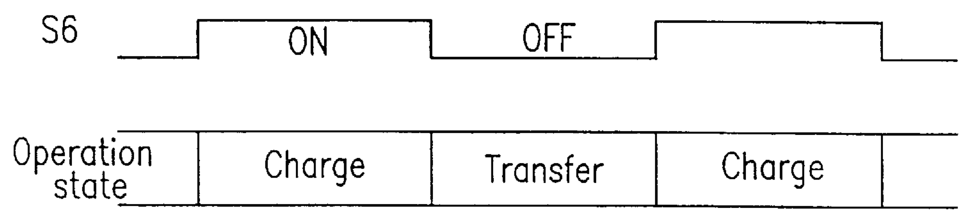
FIG. 14 is a chart illustrating the ON/OFF states of a switch S6 and the operation states (charge and transfer) of the intermediate holding circuit 9.

FIG. 14 is a chart illustrating the ON/OFF states of the switch S6 and the operation states (charge and transfer) of the intermediate holding circuit 9. During a charge period, the switch S6 is ON and the holding capacitor 28 holds the voltage of the signal output from the first amplifier circuit 6. During a transfer period, charge corresponding to the held voltage is transferred to the second amplifier circuit 15. This charge transfer will be described in detail later.

Figure 15:
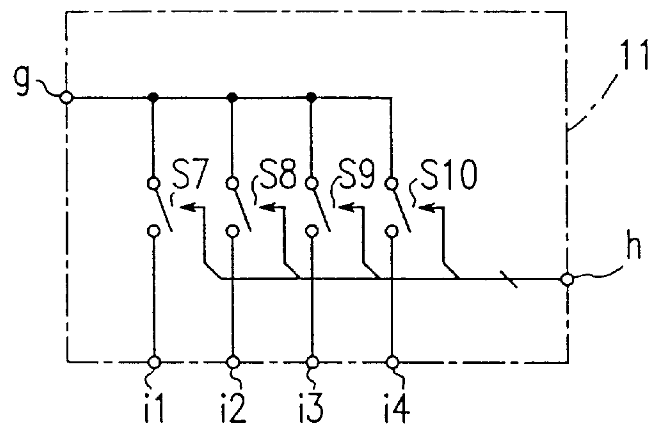
FIG. 15 is a circuit diagram of a demultiplexer 11.

FIG. 15 is a circuit diagram of the demultiplexer 11. A signal output from the intermediate holding circuit 9 is received through a terminal g. When one of the switches S7 to S10 is turned exclusively ON, the input signal is selectively output to one of the terminals i1 to i4. Signals controlling the ON/OFF states of the switches S7 to S10 are received through a terminal h.

Figure 16:
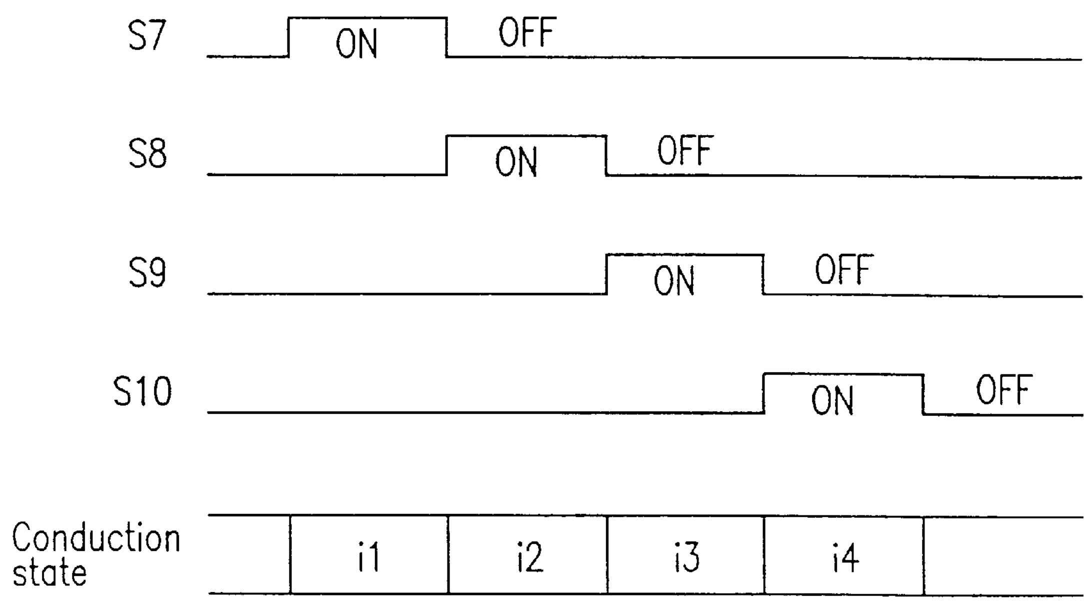
FIG. 16 is a chart illustrating the ON/OFF states of switches S7 to S10 and the conduction states (i1 to i4) of the demultiplexer 11.

FIG. 16 is a chart illustrating the ON/OFF states of the switches S7 to S10 and the conduction states (i1 to i4) of the demultiplexer 11. When any of the switches S7 to S10 is ON, the terminal g is connected to the corresponding terminal i1, i2, i3 or i4. The terminals i1 to i4 of each of the demultiplexers 11*a* to 11*i* are connected to the signal lines si1 to si4, respectively.

Figure 17:
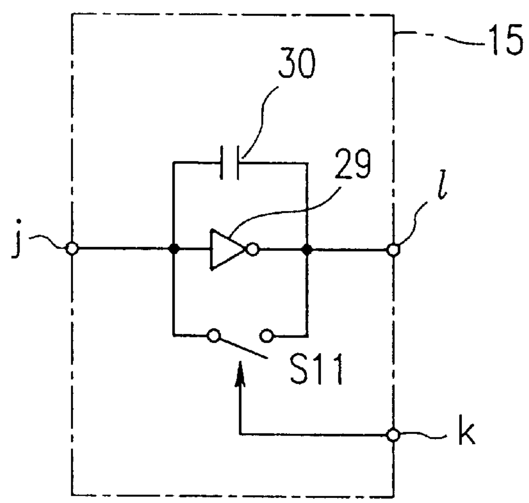
FIG. 17 is a circuit diagram of a second amplifier circuit 15.

FIG. 17 is a circuit diagram of the second amplifier circuit 15. The terminals j of the second amplifier circuits 15*a* to 15*d* are connected to the signal lines si1 to si4, respectively. An inverting amplifier 29 receives the output from the demultiplexer 11 at the terminal j via the signal line bus 12. A feedback capacitor 30 is connected to the input terminal and the output terminal of the inverting amplifier 29. A switch S11 is connected to the two terminals of the feedback capacitor 30. In discharging the charge accumulated in the feedback capacitor 30, the feedback capacitor 30 is turned ON. Signals controlling the ON/OFF states of the switch S11 are received through a terminal k. A signal output from the output terminal of the inverting amplifier 29 is output through a terminal 1.

Figure 18:
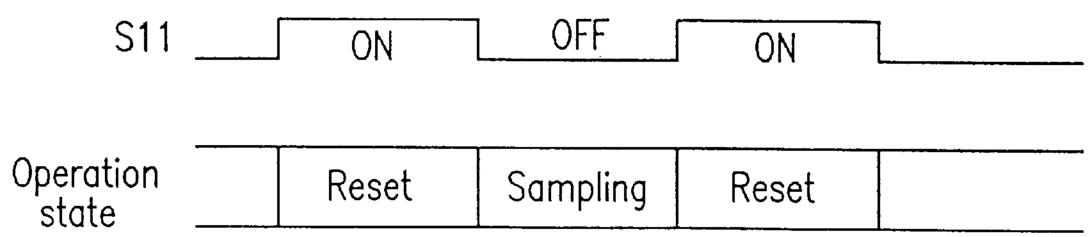
FIG. 18 is a chart illustrating the ON/OFF states of a switch S11 and the operation states (reset and sampling) of the second amplifier circuit 15.

FIG. 18 is a chart illustrating the ON/OFF states of the switch S11 and the operation states (reset and sampling) of the second amplifier circuit 15. When the switch S11 is ON, the feedback capacitor 30 is short-circuited so that the second amplifier circuit 15 is turned into the reset state. That is to say, in the reset state, a voltage Va when the input terminal and the output terminal of the inverting amplifier 29 are short-circuited is output through the terminal 1. When the switch S11 is OFF, charge corresponding to the input voltage is accumulated in the feedback capacitor 30 and a sampling operation is performed.

Figure 19:
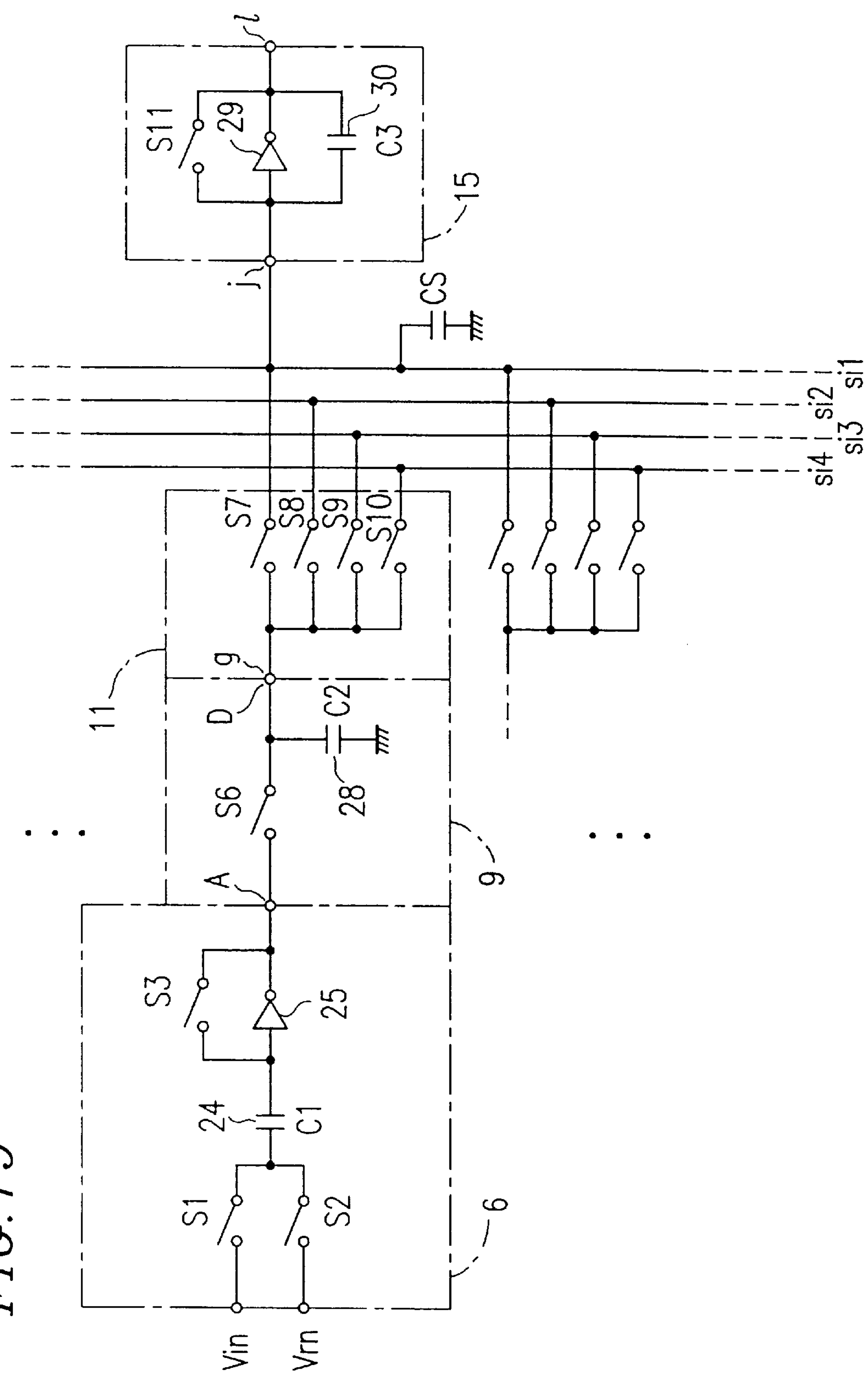
FIG. 19 is a circuit diagram showing the components respectively representing the first amplifier circuit 6, the intermediate holding circuit 9, the demultiplexer 11, a signal line bus 12 and the second amplifier circuit 15 of the A/D converter shown in FIG. 8.
Figure 22:
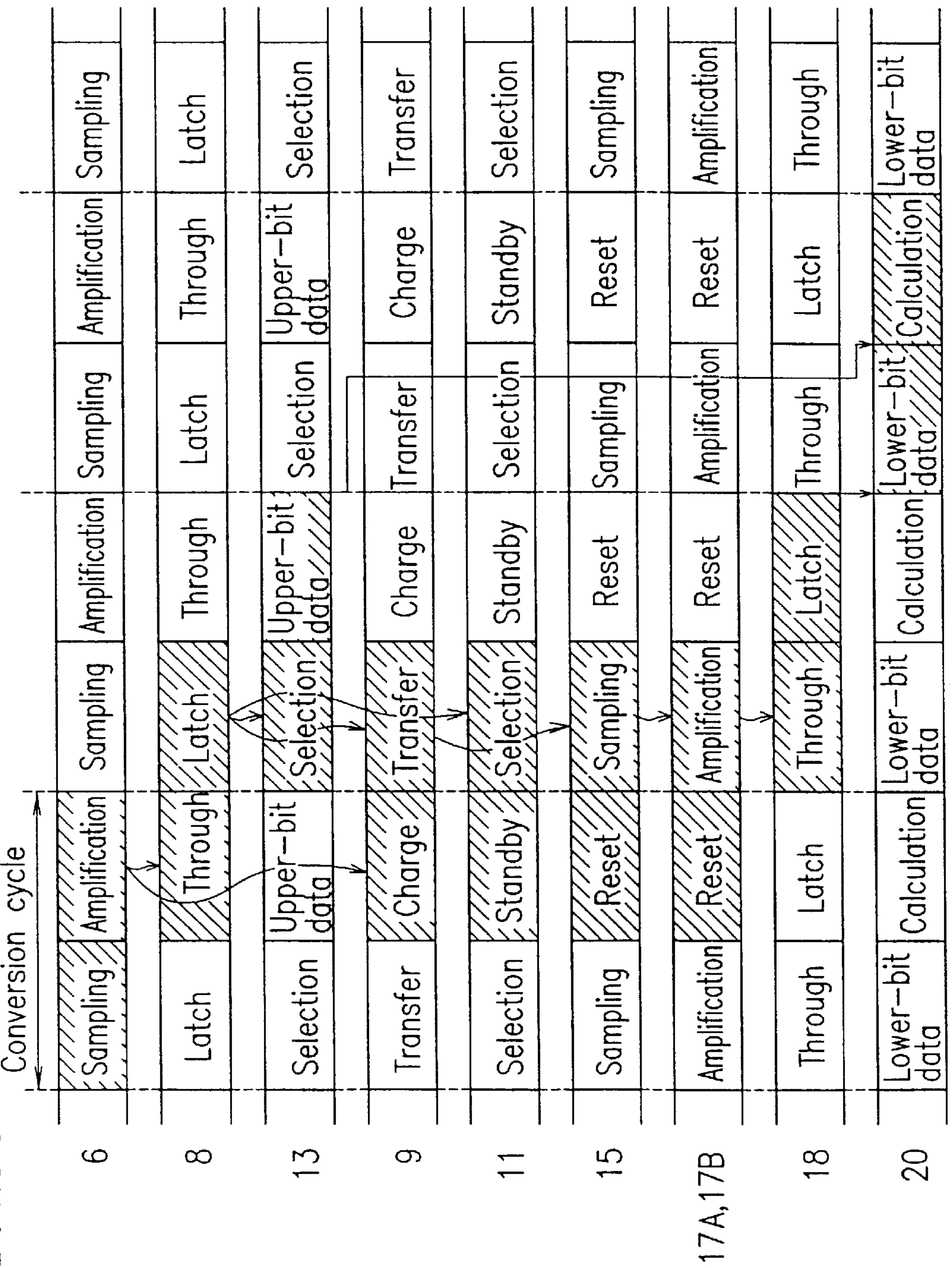
FIG. 22 is a timing diagram illustrating the timings of the operations performed by the respective circuit components shown in FIG. 8.
Figure 23:
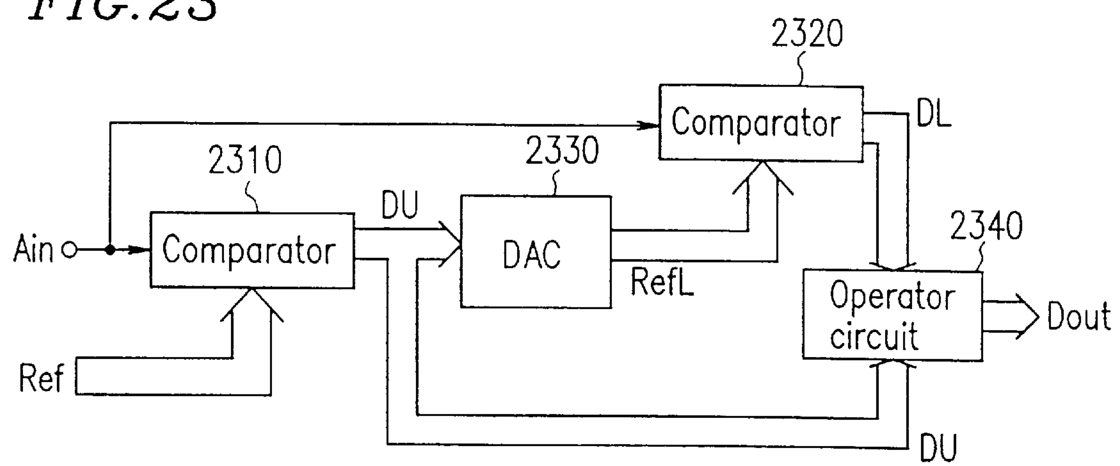
FIG. 23 is a block diagram showing a prior art serial-parallel A/D converter.

The operations of the first amplifier circuit 6, the intermediate holding circuit 9, the demultiplexer 11, the signal line bus 12 and the second amplifier circuit 15 will be described in detail using Equations 7 to 35 and referring to FIGS. 8, 19 and 22. FIG. 19 is a circuit diagram showing the components respectively representing the first amplifier circuit 6, the intermediate holding circuit 9, the demultiplexer 11, the signal line bus 12 and the second amplifier circuit 15 of the A/D converter shown in FIG. 8. FIG. 22 is a timing diagram illustrating the timings of the operations performed by the respective circuit components shown in FIG. 8. In FIG. 22, the respective operations are sequentially performed from the left to the right along the passage of time.

In FIG. 19, when the first amplifier circuit 6 is in the amplification state, the output voltage Vol at the terminal A of the first amplifier circuit 6 is given by the above-described Equation 7:

$$Vol=-G\cdot(Vrn-Vin)+Va \tag{7}$$

When the first amplifier circuit 6 is in the amplification state, the intermediate holding circuit 9 is in the charge state (see FIG. 22) and the switch 6 is ON. The holding capacitor 28 of the intermediate holding circuit 9 charges the output voltage Vol of the first amplifier circuit 6. When the capacitance value of the holding capacitor 28 is denoted by C2, the charge Q2 accumulated in the holding capacitor 28 is given by the following Equation 8:

$$Q2=C2\cdot(-G\cdot(Vrn-Vin)+Va) \tag{8}$$

If a part of Equation 8 is expanded, the following Equation 9 is obtained:

$$Q2=C2\cdot(-G\cdot(Vrn-Vin))+C2\cdot Va \tag{9}$$

If the first term and the second term of the right side of Equation 9 are denoted by Q2$a$ and Q2$b$, respectively, then Q2$a$ and Q2$b$ are given by the following Equations 10 and 11:

$$Q2a=C2\cdot(-G\cdot(Vrn-Vin)) \tag{10}$$

$$Q2b=C2\cdot Va \tag{11}$$

When the switch S7 of the demultiplexer 11 is ON and the switches S8, S9 and S10 thereof are OFF, the terminal g of the demultiplexer 11 is connected to the signal line si1 of the signal line bus 12. In this case, the switch S6 of the intermediate holding circuit 9 is OFF. As shown in FIG. 8, nine demultiplexers are connected to each of the four signal lines si1, si2, si3 and si4. Consequently, a parasitic capacitance having a non-negligible value exists at a connection point between each of the switches S7 to S10 and a corresponding signal line si1, si2, si3 or si4. In FIG. 19, the parasitic capacitance is represented as a capacitor CS connected to the signal line si1.

The second amplifier circuit 15 receives the charge Q2$a$ which has been accumulated in the holding capacitor 28 of the intermediate holding circuit 9. The second amplifier circuit 15 performs a reset operation (when the switch S11 is ON) before performing a sampling operation (i.e., an operation for receiving the charge Q2$a$ ) after the switch S11 is turned OFF. The period during which this reset operation is performed is a standby period during which all the switches S7 to S10 of the demultiplexer 11 are OFF. Therefore, in the reset period, the voltage at the terminal j is equal to the voltage Va which is output when the switch S11 of the second amplifier circuit 15 is ON. Thus, the charge QSr accumulated in the parasitic capacitor CS during the reset period is given by the following Equation 12:

$$Qsr=CS\cdot Va \tag{12}$$

Furthermore, since the switch S11 is ON during the reset period, the charge Q3$r$ to be charged to the capacitor 30 (a capacitance value: C3) is zero:

$$Q3r=0 \tag{13}$$

In the sampling period of the second amplifier circuit 15, the switch S7 of the demultiplexer 11 is ON while the switch S6 of the intermediate holding circuit 9, the switch S11 of the second amplifier circuit 15 and the switches S8 to S10 of the demultiplexer 11 are OFF. As a result, the charge Q2$a$ accumulated in the holding capacitor 28 of the intermediate holding circuit 9 is transferred to the second amplifier circuit 15. Hereinafter, the steps for transferring this charge will be described by using equations. When the voltage at the terminal j during the sampling period is denoted by (Vj+Va), the output voltage Vo2 of the second amplifier circuit 15 is given by the following Equation 14:

$$Vo2=-G\cdot Vj+Va \tag{14}$$

where (−G) (G>>0) is a voltage gain of the inverting amplifier 29 of the second amplifier circuit 15. A differential voltage Vjl between the terminals j and l is given by the following Equation 15:

$$Vjl=(Vj+Va)-Vo2 \tag{15}$$

If Equation 14 is substituted into Equation 15, then the following Equation 16 is obtained:

$$Vjl=(1+G)\cdot Vj \tag{16}$$

The charge Q3$h$ to be accumulated in the capacitor 30 having a capacitance value of C3 is given by the following Equation 17:

$$Q3h=C3\cdot Vjl \tag{17}$$

If Equation 16 is substituted into Equation 17, the following Equation 18 is obtained:

$$Q3h=C3\cdot(1+G)\cdot Vj \tag{18}$$

The charge Q2$h$ to be accumulated in the holding capacitor 28 having a capacitance value of C2 is given by the following Equation 19:

$$Q2h=CS\cdot(Vj+Va) \tag{19}$$

The charge QS$h$ to be accumulated in the parasitic capacitor CS is given by the following Equation 20:

$$QSh=CS\cdot(Vj+Va) \tag{20}$$

Since the amounts of the charge accumulated in the capacitors C2, CS and C3 are conserved during the reset period and the sampling period, the following Equation 21 is obtained:

$$Q2+QSr+Q3r=Q2h+QSh+Q3h \tag{21}$$

If Equation 21 is rewritten with respect to the voltage Vj at the terminal j by substituting Equations 9, 12, 13, 18, 19 and 20 thereto, the following Equation 22 is obtained:

$$Vj=\{C2(-G\cdot(Vrn-Vin))\}/\{C3\cdot(1+G)+C2+CS\} \tag{22}$$

If the numerator and the denominator of Equation 22 are divided by G, the following Equation 23 is obtained:

$$Vj=\{-C2(Vrn-Vin)\}/\{C3(1/G+1)+C2/G+CS/G\} \tag{23}$$

Herein, considering actually designed values, the following relationship (24) is obtained:

$$C2,\ C3,\ CS \ll G \tag{24}$$

When Equation 24 is applied to Equation 23, Equation 22 is modifiable into the following Equation 25 easier to understand:

$$Vj=-C2/C3\cdot(Vrn-Vin) \tag{25}$$

That is to say, a voltage variation represented by Equation 25 is transmitted to the terminal j shown in FIG. 19. The transmitted signal is a voltage obtained by multiplying a differential voltage between the reference voltage Vrn and the voltage Vin of the analog signal by a factor (−C2/C3). Thus, a voltage corresponding to a voltage (Vrn−Vin) to be A/D converted has been transmitted. Also, Equation 25 means that the voltage Vj to be transmitted is not affected by the parasitic capacitor CS. This is because the negative feedback operation performed by the inverting amplifier 29 owing to the feedback capacitor 30 suppresses the voltage variation at the terminal j shown in FIG. 19, so that the parasitic capacitor 30 is hardly charged or discharged. Thus, the second amplifier circuit 15 can operate without being affected by the parasitic capacitor CS, which fact is a remarkable advantage attained by the signal transmission circuit, the signal transmission method and the A/D converter according to the present invention over prior art ones. As is apparent from the foregoing description, even when a parasitic capacitor CS having a large value exists on the signal lines si1 to si4, the present invention realizes an efficient signal transmission so that the circuit of the invention can be operated at a high speed. The voltage Vo2 at the terminal 1 is given by the following Equation 26:

$$Vo2=-G\cdot Vj+Va \tag{26}$$

If Equation 25 is substituted into Equation 26, the following Equation 27 is obtained:

$$Vo2=G\cdot C2/C3\cdot(Vrn-Vin)+Va \tag{27}$$

Figure 20:
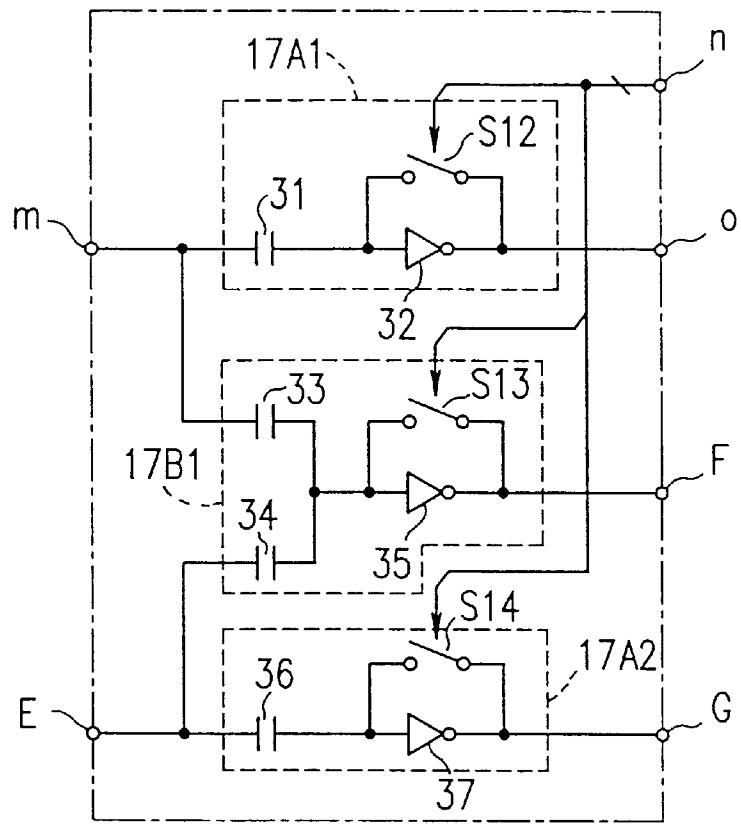
FIG. 20 is a circuit diagram of third amplifier circuits 17A and 17B.

FIG. 20 is a circuit diagram of the third amplifier circuits 17A and 17B. In FIG. 20, only the third amplifier circuits 17A1, 17A2 and 17B1 are shown. However, the other third amplifier circuits 17A3, 17A4, 17B2 and 17B3 also have a similar configuration.

Sampling capacitors 31 and 36 sample the voltages input through the terminals m and E, respectively. Interpolation capacitors 33 and 34 are connected in series and have the same capacitance value. Therefore, the voltage at the connection point between the interpolation capacitors 33 and 34 is equal to the average of the voltages at the terminals m and E. Inverting amplifiers 32, 35 and 37 receive the voltage at the terminal m, the average of the voltages at the terminals m and E and the voltage at the terminal E, respectively, amplify the respective voltages and then output the amplified voltages through terminals o, F and G, respectively. Switches S12 to S14 respectively turn the input terminals and the output terminals of the inverting amplifiers 32, 35 and 37 into a short-circuit state or an open state. The terminal m is connected to the output terminal 1 of a second amplifier circuit 15. The terminal E is connected to the output terminal 1 of another second amplifier circuit 15 adjacent to the second amplifier circuit 15 connected to the terminal m. Signals controlling the ON/OFF states of the switches S12 to S14 are received through a terminal n.

Figure 21:
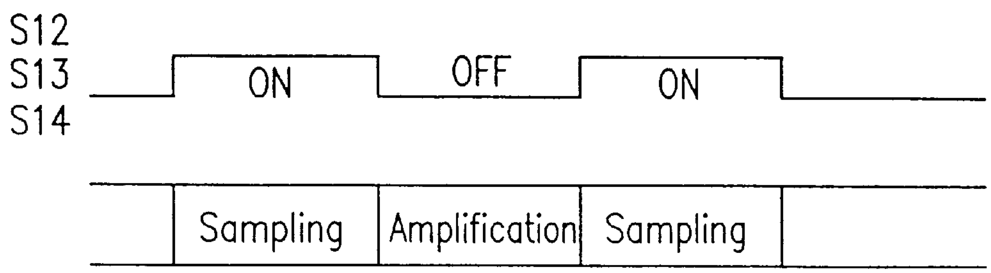
FIG. 21 is a chart illustrating the ON/OFF states of switches S12 to S14 and the operation states (sampling and amplification) of the third amplifier circuits 17A and 17B.

FIG. 21 is a chart illustrating the ON/OFF states of the switches S12 to S14 and the operation states (sampling and amplification) of the third amplifier circuits 17A and 17B. When any of the switches S12 to S14 is ON, the corresponding third amplifier circuit 17A or 17B samples the input signal. On the other hand, when any of the switches S12 to S14 is OFF, the corresponding third amplifier circuit 17A or 17B compares the voltage of the input signal with the voltage sampled during the sampling period. Hereinafter, the operation of the third amplifier circuits 17A and 17B will be described in detail.

Referring to FIG. 22 again, while the third amplifier circuits 17A and 17B are in the reset period (i.e., the sampling period in FIG. 21), the second amplifier circuits 15 on the preceding stage are also in the reset period. The voltages input to the terminals m and E are equal to the voltage Va output when the switch S11 of the second amplifier circuit 15 is ON. If the voltages input to the terminals m and E while the third amplifier circuits 17A and 17B are in the amplification state are denoted by Vo2*m* and Vo2E, respectively, then the following Equations 28 and 29 are obtained:

$$Vo2m=G\cdot C2/C3\cdot(Vrn-Vin)+Va \tag{28}$$

$$Vo2E=G\cdot C2/C3\cdot(Vr(n+1)-Vin)+Va \tag{29}$$

where the voltages Vrn and Vr (n+1) are reference voltages from the adjacent reference voltage bank 4. The voltages Vo2*m* and Vo2E correspond to the reference voltages in the first amplifier circuits 6. Thus, the output voltages Vo3*o* and Vo3G of the third amplifier circuits 17A1 and 17A2 are respectively given by the following Equations 30 and 31 by reference to Equation 7:

$$Vol=-G\cdot(Vrn-Vin)+Va \tag{7}$$

$$Vo3o=-G\cdot(Vo2m-Va)+Va \tag{30}$$

$$Vo3G=-G\cdot(Vo2E-Va)+Va \tag{31}$$

If Equations 28 and 29 are substituted into Equations 30 and 31, respectively, then the following Equations 32 and 33 are obtained:

$$Vo3o=-G\cdot G\cdot C2/C3\cdot(Vrn-Vin)+Va \tag{32}$$

$$Vo3G=-G\cdot G\cdot C2/C3\cdot(Vr(n+1)-Vin)+Va \tag{33}$$

Since the capacitance values of the capacitors 33 and 34 are equal, the voltage at the terminal F is equal to an intermediate value between the voltage at the terminal o and the voltage at the terminal G. Thus, the output voltage Vo3F at the terminal F is given by the following Equation 34:

$$Vo3F=(Vo3o+Vo3G)/2 \quad (34)$$

If Equations 32 and 33 are substituted into Equation 34, then the following Equation 35 is obtained:

$$Vo3F=-G\cdot G\cdot C2/C3\cdot((Vrn+Vr(n+1))/2-Vin)+Va \quad (35)$$

If Equation 35 is compared with Equations 32 and 33, a reference voltage (Vrn+Vr (n+1))/2) which is intermediate between the adjacent reference voltages Vrn and Vr (n+1) is obtained in the circuit shown in FIG. 20, so that the data after the A/D conversion (i.e., the resolution of the A/D conversion) can be increased. The voltages Vo3_o_, Vo3G and Vo3F output from the third amplifier circuits 17A and 17B are converted by the second latch circuits 18 (see FIGS. 8 and 11) into digital values. The digital values output from the second latch circuits 18 are encoded by the lower-bit data processor circuit 20 into lower-bit digital values.

In this embodiment, the lower-bit data processor circuit 20 outputs +1, 0 and −1 as carry bits to the operator circuit 21. Thus, for example, even when the upper-bit data processor circuit 13 outputs an erroneous result indicating that the voltage Vin is located between the voltages Vr3 and Vr4 though the voltage Vin is in fact a little larger than the voltage Vr3 (assuming that Vr1>Vr9), such an error can be corrected advantageously by the use of the carry bits. Based on the upper-bit digital value, the lower-bit digital value and the carry bits, the operator circuit 21 outputs a final digital value having all the converted bits (herein upper 3 bits and lower 1 bit, i.e., 4 bits in total) to the terminal 23. The clock generator circuit 19 generates a clock signal to be supplied to the respective circuit blocks described above.

FIG. 22 will be referred to again. Assuming that each of the various operations shown in the timing chart of FIG. 22 is executed for a duration corresponding to one clock cycle (hereinafter, such a duration will be referred to as "one clock period"), the conversion cycle is equal to two clock periods. In other words, only two clock periods are required for converting an analog signal input at a certain time into a digital signal. Thus, in the A/D converter of the present invention, each of the first amplifier circuit 6, the first latch circuit 8, the upper-bit data processor circuit 13, the intermediate holding circuit 9, the demultiplexer 11, the second amplifier circuit 15, the third amplifier circuits 17A and 17B, the second latch circuit 18 and the lower-bit data processor circuit 20 can perform pipeline-like processing within two clock periods. As a result, the present invention realizes a high-speed A/D conversion while consuming less power.

The first amplifier circuit 6 outputs a voltage corresponding to a difference between a reference voltage and an input voltage in two clock periods for sampling and amplification. The first latch circuit 8 converts the signal received from the first amplifier circuit 6 into a digital value and then outputs the digital value to the upper-bit data processor circuit 13 in two clock periods for through and latch. The upper-bit data processor circuit 13 controls the demultiplexer 11 such that signals corresponding to the four reference voltages in the vicinity of the input voltage Vin are output from the intermediate holding circuit 9 to the corresponding signal lines si1 to si4 based on the digital value supplied from the first latch circuit 8. For example, when the voltage Vin is located between the voltages Vr3 and Vr4, the upper-bit data processor circuit 13 controls the demultiplexer 11 such that the outputs of the intermediate holding circuits 9_b_ to 9_e_ are selectively supplied to the signal lines si1 to si4, respectively. The upper-bit digital value output from the upper-bit data processor circuit 13 is combined with the lower-bit digital value to be output from the lower-bit data processor circuit 20 one clock period later to produce a final digital value having all bits.

The intermediate holding circuit 9 first charges the output from the first amplifier circuit 6. Next, the intermediate holding circuit 9 transfers charge to the second amplifier circuit 15 via the demultiplexer 11 in a clock period during which the first latch circuit 8 is in the latch state. The second amplifier circuit 15 receives and samples the voltage output from the intermediate holding circuit 9 in a clock period during which the demultiplexer 11 is in the selection state. The third amplifier circuits 17A and 17B receive and amplify the sampled voltage. The second latch circuit 18 converts the voltage amplified by the third amplifier circuits 17A and 17B into a digital value and then outputs the digital value to the lower-bit data processor circuit 20 in the latch state. In the clock period during which the lower-bit data processor circuit 20 performs calculations, since the upper-bit digital value and the lower-bit digital value can be obtained from the upper-bit data processor circuit 13 and the lower-bit data processor circuit 20, respectively, a final digital value having all the bits can be calculated. As shown in FIG. 22, a time lag between an input analog signal and an output digital signal is 5 clock periods. However, the operation of each circuit component is finished within two clock periods.

In the above-described embodiment, an upper-bit digital value has 3-bit information and a lower-bit digital value has 1-bit information. However, the numbers of bits representing these digital values are not limited to these specific values.

EXAMPLE 3

Hereinafter, the results obtained by comparing the signal transmission circuit of the present invention with a prior art signal transmission circuit by means of a simulation will be described.

Figure 24:
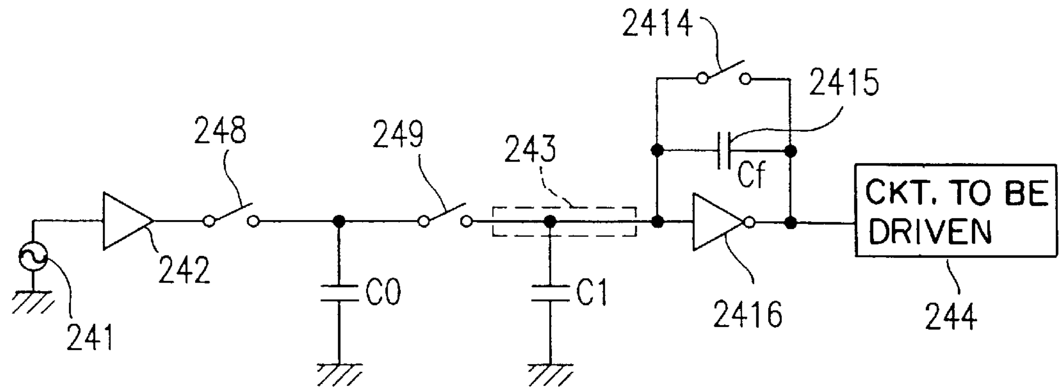
FIG. 24 is a circuit diagram of the signal transmission circuit of the present invention.

FIG. 24 is a circuit diagram of the signal transmission circuit of the present invention. A driver circuit 242 receives a signal from an input signal source 241, amplifies the received signal and then outputs the amplified signal to one terminal of a switch 248. In a holding state, switches 248 and 2414 are ON and a switch 249 is OFF so that a capacitor C0 holds the charge corresponding to the output of the input signal source 241. In a transfer state, the switch 249 is ON and the switches 248 and 2414 are OFF so that the charge held in the capacitor C0 is transferred to the input terminal of an inverter 2416 through a signal line 243. The switch 2414 and a feedback capacitor 2415 are connected to the input terminal and the output terminal of the inverter 2416, which amplifies a signal provided to the input terminal thereof and then outputs the amplified signal to a circuit 244 to be driven. In this case, an equivalent capacitance substantially equal to a value obtained by multiplying the capacitance Cf of the feedback capacitor 2415 by the gain of the inverter 2416 is regarded as being connected between the input terminal of the inverter 2416 and a ground.

Figure 25:
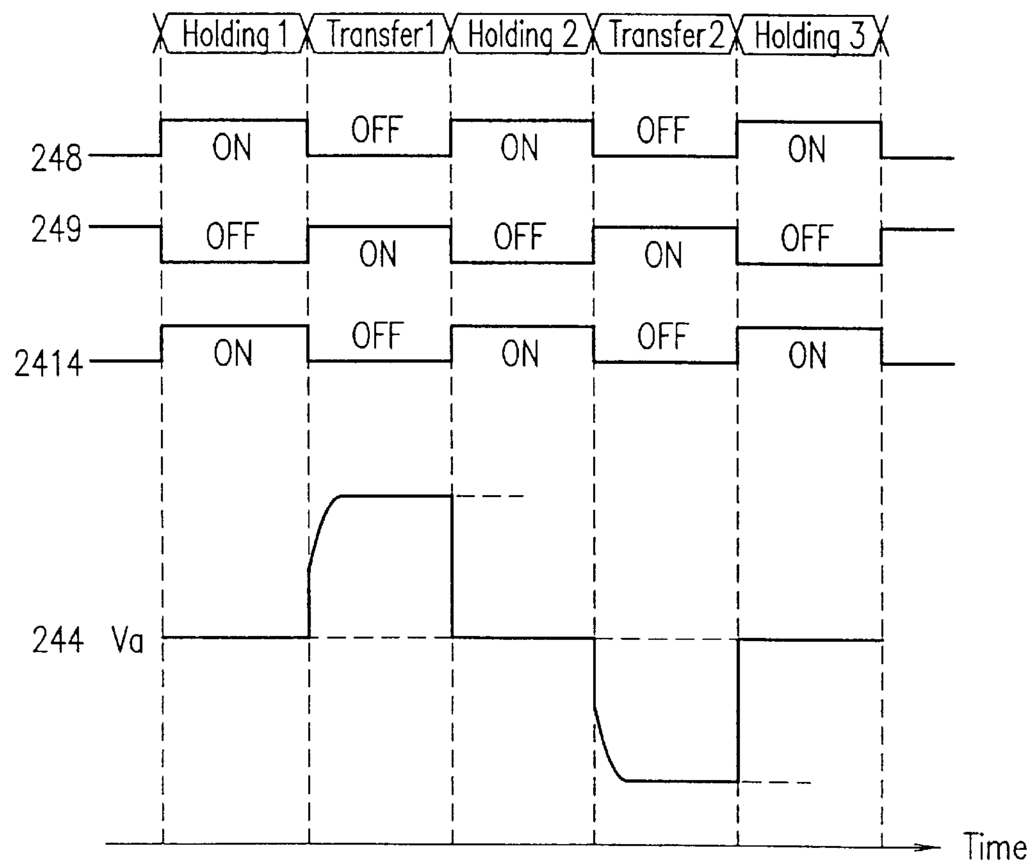
FIG. 25 is a chart illustrating the operation timings of the switches 248, 249 and 2414 and the variation in the input voltage of the circuit 244 to be driven in the signal transmission circuit shown in FIG. 24.

FIG. 25 is a chart illustrating the operation timings of the switches 248, 249 and 2414 and the variation in the input voltage of the circuit 244 to be driven in the signal transmission circuit shown in FIG. 24. In the period of holding (1), the switch 2414 is ON and the voltages at the input and output terminals of the inverter 2416 are fixed at an equal voltage value Va. In this case, the feedback capacitor 2415 accumulates no charge therein.

Next, when the period of transfer (1) starts, the switch 2414 is turned OFF. In this case, in accordance with the amount of the charge which has been accumulated in the holding capacitor 2410, the charge is distributed to the capacitor C1 and the feedback capacitor 2415 via the switch 249. In the case where the absolute value |A| of the gain of the inverter 2416 is sufficiently larger than 1, the value of the capacitor C1 of the signal line 243 no longer governs so that a difference between the output voltage of the inverter 2416 and the voltage Va can be controlled by the ratio of the capacitance value of the capacitor C0 to that of the capacitor Cf.

As described above, in the signal transmission circuit shown in FIG. 24, it is possible to amplify a differential voltage between the input voltage to the circuit 244 to be driven and the reference voltage and to control the amplification factor by arbitrarily setting the gain of the inverter 2416 and the capacitance ratio between the holding capacitor C0 and the feedback capacitor 2415.

Figure 26:
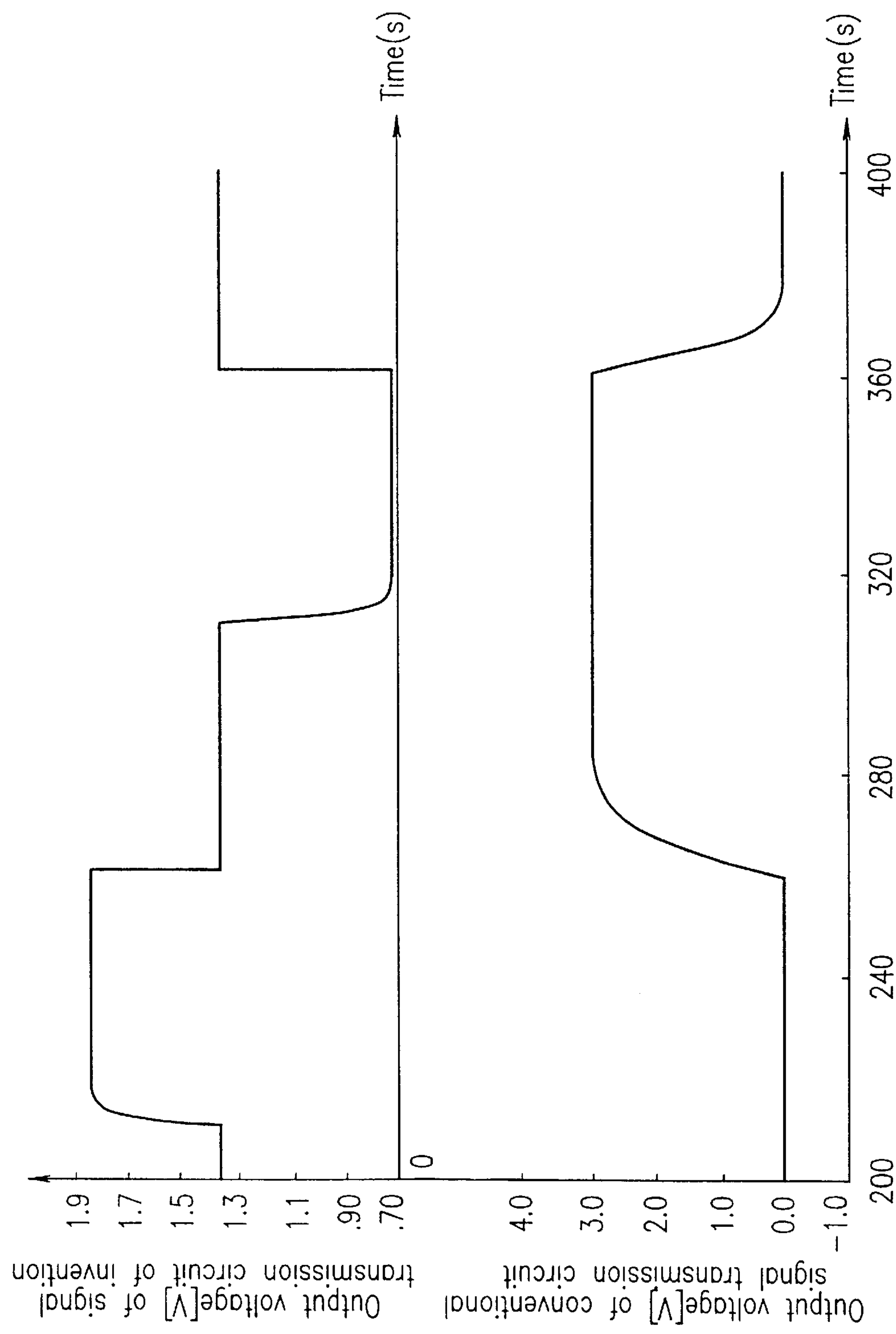
FIG. 26 is a waveform chart showing in comparison the waveform of an output voltage of the signal transmission circuit of the present invention shown in FIG. 24 and that of an output voltage of a conventional signal transmission circuit shown in FIG. 27.
Figure 27:
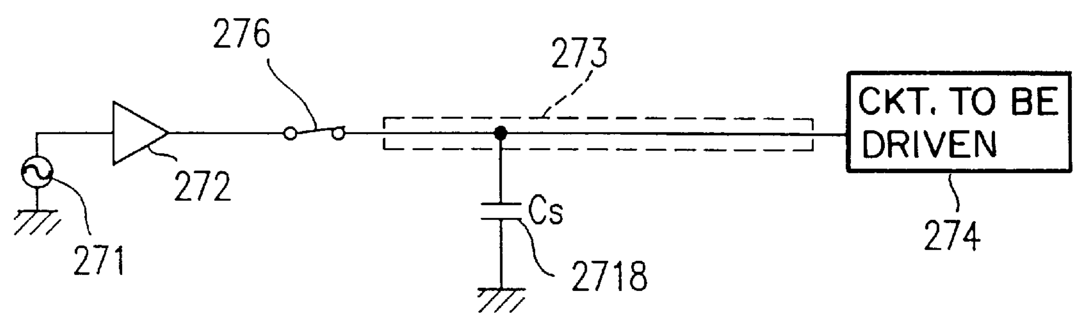
FIG. 27 is a diagram showing the configuration of a conventional signal transmission circuit.

FIG. 26 is a waveform chart showing in comparison the waveform of an output voltage of the signal transmission circuit of the present invention shown in FIG. 24 and that of an output voltage of a conventional signal transmission circuit shown in FIG. 27. Both the waveforms have been obtained by means of a simulation. FIG. 27 is a diagram showing the configuration of a conventional signal transmission circuit. A driver circuit 272 receives an output from an input signal source 271, amplifies the received signal and then outputs the amplified signal to one terminal of a selection switch 276. A circuit 274 to be driven receives a signal via a signal line 273 connected to the selection switch 276. A parasitic capacitor 2718 exists between the signal line 273 and ground.

Figure 28:
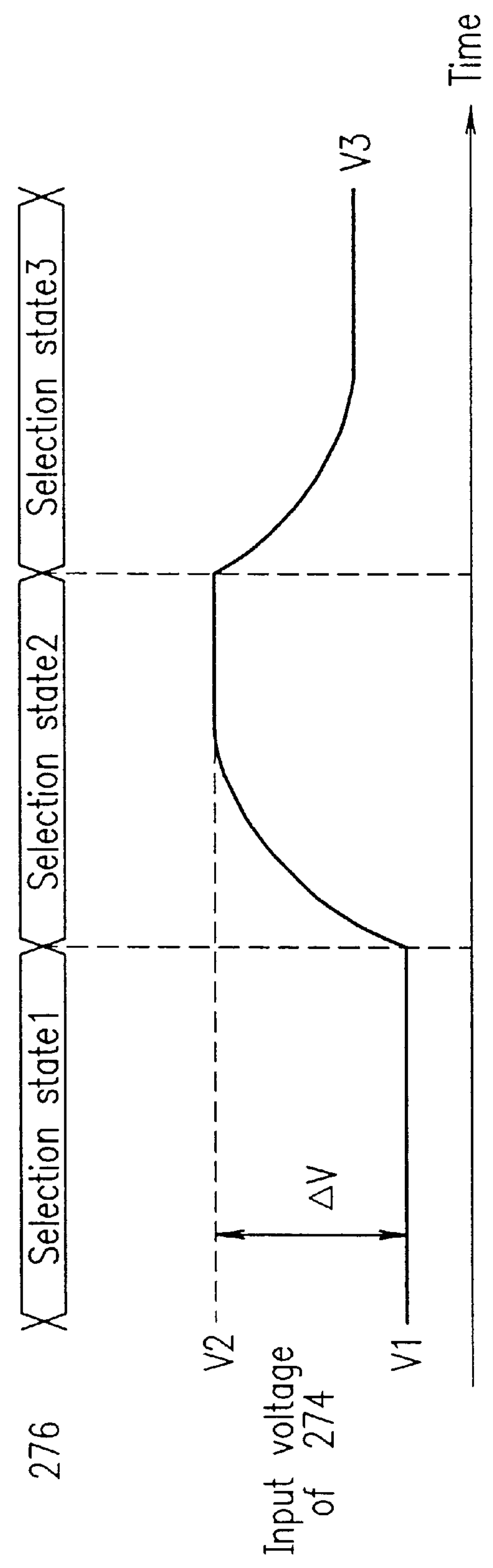
FIG. 28 is a diagram showing the selection states of the selection switch and the input voltage of the circuit 274 to be driven in the conventional signal transmission circuit shown in FIG. 27.

FIG. 28 is a diagram showing the selection states of the selection switch 276 of the conventional signal transmission circuit shown in FIG. 27 and the input voltage of the circuit 274 to be driven. In FIG. 28, the axis of the abscissas indicates a time. In FIG. 28, in a selection state (2) where the selection switch 276 is ON, the input voltage of the circuit 274 to be driven increases from a voltage V1 to a voltage V2 by ΔV. When the switch 276 is turned OFF in a selection state (3), the input voltage of the circuit 274 to be driven converges at a voltage V3.

The following Table 1 shows in comparison the simulation results of the current to be consumed and the settling time of the signal transmission circuit of the present invention and those of a conventional signal transmission circuit.

TABLE 1

| | Conventional | This invention |
|---|---|---|
| consumed current | 190 μA | 180 μA |
| settling time | 38 ns | 13 ns |

When a substantially equal amount of current is consumed by the signal transmission circuit of the invention and the conventional signal transmission circuit, the settling time of the signal transmission circuit of the invention is shortened to about one-third of that of the conventional circuit.

In this example, the configuration of the inverter 2416 and the capacitance value of the feedback capacitor 2415 may be arbitrarily selected. In addition, the switches 248, 249 and 2414 may be operated at respectively arbitrary timings so long as the operation of the signal transmission circuit is not affected.

EXAMPLE 4

Figure 29:
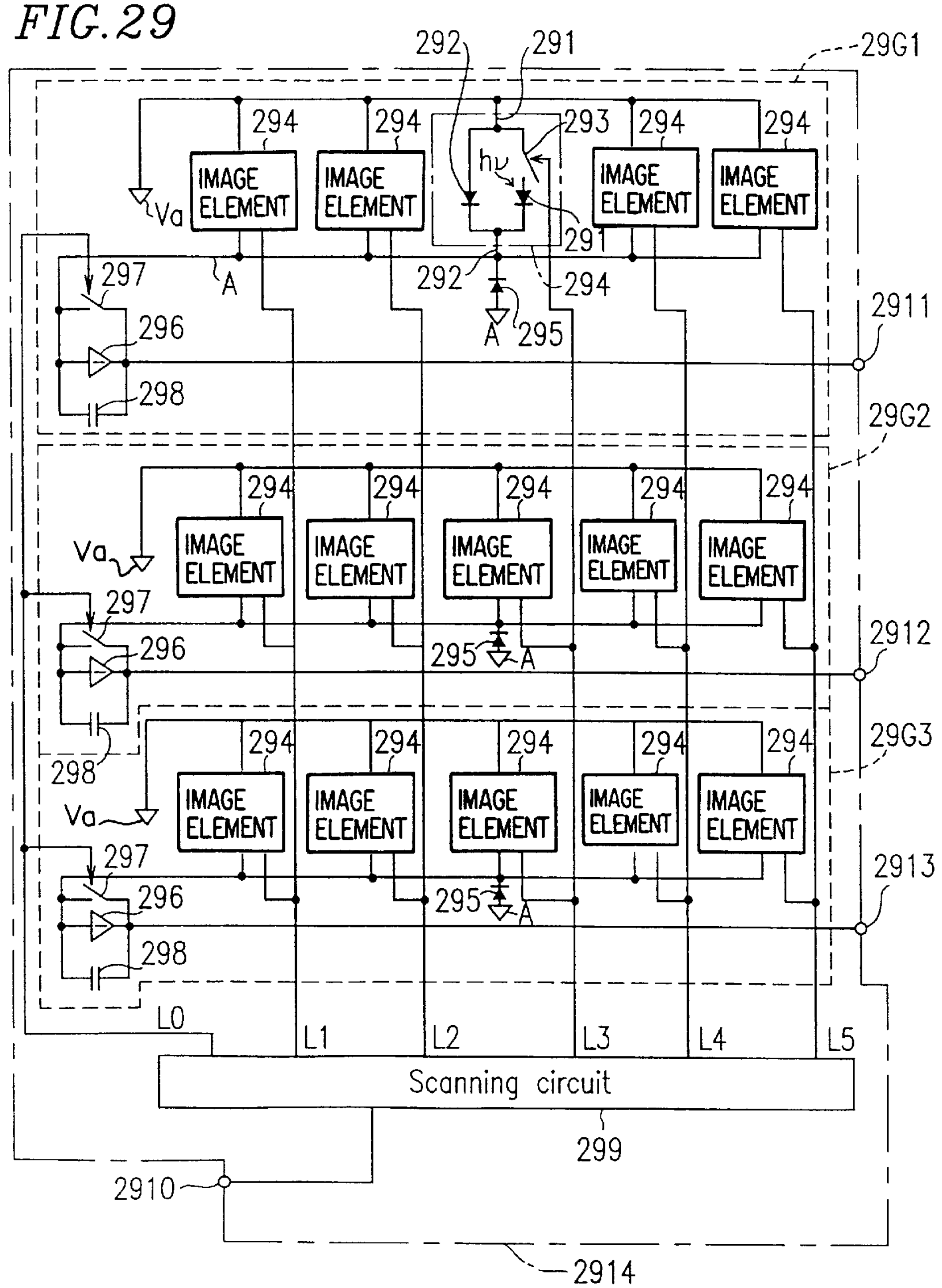
FIG. 29 is a circuit diagram of a solid-state imaging element using the signal transmission circuit of the invention.

FIG. 29 is a circuit diagram of a solid-state imaging element using the signal transmission circuit of the invention. In FIG. 29, the reference numeral 291 denotes a diode for converting light into charge (i.e., a so-called "photodiode"); 292 and 295 denote parasitic diodes; and 293 denotes a switch. The anode of the diode 291 is connected to one terminal of the switch 293 while the cathode thereof is connected to a node A. The other terminal of the switch 293 is connected to a constant voltage Va. The anode of the parasitic diode 295 is connected to the constant voltage V while the cathode thereof is connected to the node A. The switch 293 and the diodes 291 and 292 constitute an image element 294. In the exemplary configuration shown in FIG. 29, an image element 294 includes a parasitic diode 292 in addition to a diode 291 and a switch 293, and a parasitic diode 295 is further considered as existing between the node A and the constant voltage A. These parasitic diodes are considered because these diodes are caused in the case of forming the image element 294 of a MOS transistor.

The diode 291 shown in FIG. 29 includes as a parasitic capacitance a junction capacitance caused by an inverse bias. The junction capacitance corresponds to C0 shown in FIG. 1. The capacitance of the wiring connected to the node A and the parasitic capacitance of the diode 295 correspond to the capacitor C1 shown in FIG. 1. The inverter 296, the switch 297 and the capacitor 298 respectively correspond to the inverter 202, the switch 206 and the capacitor 204 shown in FIG. 5. Thus the relationship C0<<(C1+C2) and C1<C2 which are preferably satisfied as described with reference to FIG. 1 are also preferably satisfied in this example. Also, in this example, an inverter 296 with a capacitor 298 connected to the input terminal and the output terminal thereof is used. Alternatively, the variable capacitor shown in FIG. 6 may also be used instead.

The output terminals 292 of a set of five image elements 294 are commonly connected to the node A and to the input terminal of the inverter 296. The output terminals 292 of the set of five image elements 294 are commonly connected to the constant voltage A. The respective switches 293 of the five image elements 294 are ON/OFF controlled by the corresponding output signals L1 through L5 of a scanning circuit 299. The ON/OFF states of a switch 297 connected between the input and the output terminals of the inverter 296 are controlled by an output signal L0 of the scanning circuit 299. A set of five image elements 294 is regarded as an image element group on the first row 29G1 disposed two-dimensionally. Since the image element groups on the second and the third rows 29G2 and 29G3 have the same configuration as that of the image element group on the first row 29G1, a detailed description thereof will be omitted herein.

An image converged by an optical lens can be converted into an electric signal by reading out the charge accumulated in the respective image elements 294 arranged in columns and rows. That is to say, the image is converted into an electric signal corresponding to the respective image elements 294. In other words, the conversion from an image into an electric signal is realized by voltage converting the charge accumulated in the respective photodiodes 291 constituting the respective image elements 294.

Figure 30:
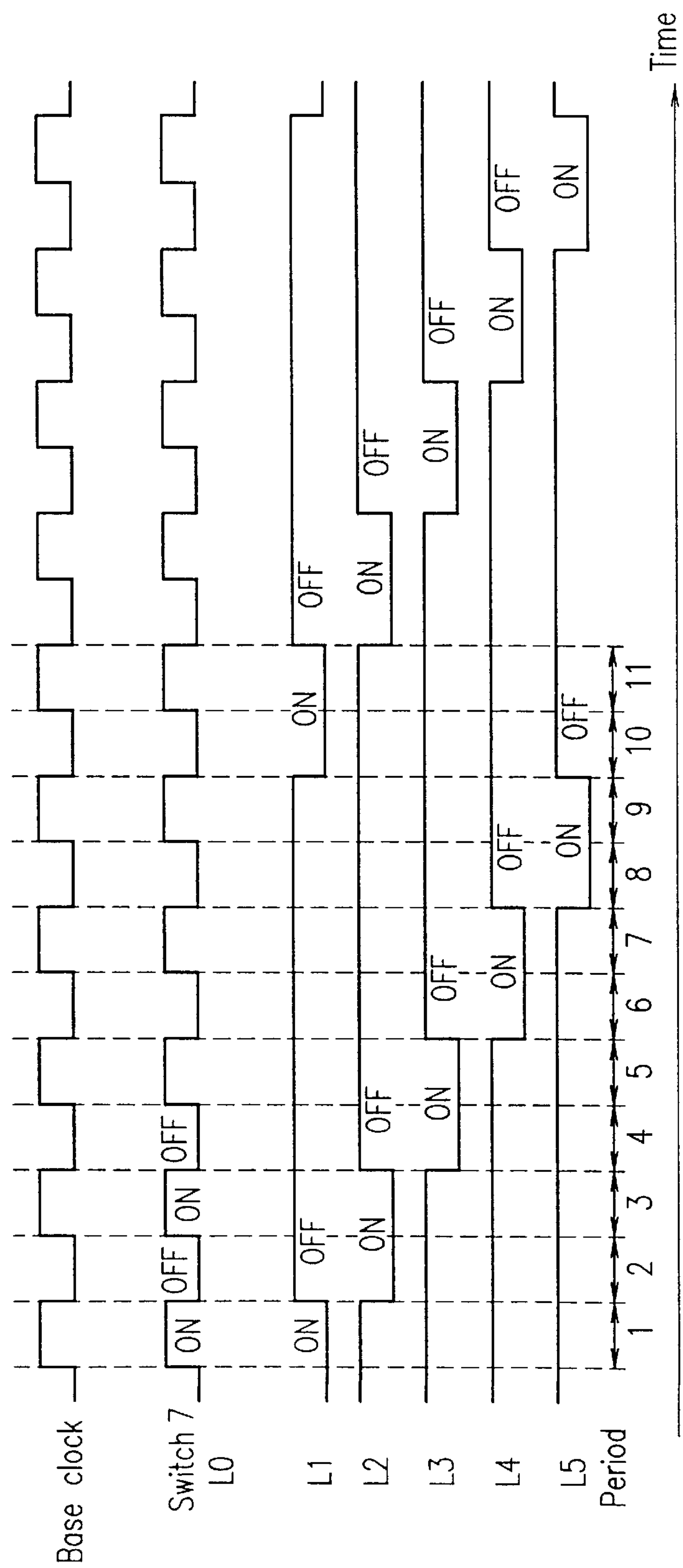
FIG. 30 is a timing chart showing a control procedure for the scanning circuit 299.

Hereinafter, the operation of the solid-state imaging element of the invention will be described. The ON/OFF states of the switch 293 in each image element 294 and those of the switch 297 connected between the input and the output terminals of each inverter 296 are controlled by the scanning circuit 299. FIG. 30 is a timing chart showing a control procedure for the scanning circuit 299. The control procedure will be described with reference to FIG. 30.

A base clock is input to the input terminal 2910 of the scanning circuit 299. Scanning clocks L0 to L5 are output by the scanning circuit 299 based on the base clock. The clock signal L0 is a control signal of the switch 297 while each of the other clock signals L1 to L5 is a control signal for the switches 293 constituting the respective image elements arranged on the corresponding column. When the clock signal L0 controlling the switch 297 is at a high level, the switch 297 is closed (or in an ON state). On the other hand, when the clock signal L0 controlling the switch 297 is at a low level, the switch 297 is open (or in an OFF state). When the clock signals L1 to L5 are at a low level, the switches 293 corresponding thereto are closed (or in an ON state). On the other hand, when the clock signals L1 to L5 are at a high level, the switches 293 corresponding thereto are open (or in an OFF state).

The objective of the first period is to initialize the amount of charge accumulated in the photodiodes 291 constituting the image elements 294 on the first column. During this period, since the switches 297 are closed, the input terminal and the output terminal of an inverting amplifier circuit are short-circuited, so that a bias voltage Vb is output from the output terminal of the inverting amplifier circuit.

Since the clock signal LI turns the switches 293 on the first column closed, the diodes 291 are connected to the constant voltage Va. Herein, the constant voltage Va is assumed to be a voltage lower than the bias voltage Vb and be able to make the diode 291 inversely biased sufficiently with respect to the parasitic diodes 292 and 295. Since the diode 291 is inversely biased, a depletion layer is developed on a p-n junction plane. The depletion layer has a low electric conductivity, so that a capacitance is caused between a p-region and an n-region. Such a capacitance will be herein called a "depletion layer capacitance". When the switch 293 is closed, the value of the depletion layer capacitance is equal to a value Cd1 determined by the differential voltage between the constant voltage Va and the bias voltage Vb. The amount of the charge accumulated in the depletion layer capacitance is assumed to be given the following equation: $Q1=Cd1\cdot(Vb-Va)$.

In the second to the ninth periods, the diodes 291 constituting the image elements on the first column have an objective of converting optical energy into an amount of charge and then accumulating the resulting charge. During these periods, the clock signal L1 turns the switches 293 constituting the image elements on the first column open. In this case, the optical energy $h\upsilon$ (where h is Planck's constant and $\upsilon$ is the frequency of light) excites the electrons bound to the atomic nuclei existing in the depletion layer on the p-n plane of the diode 291. The number of the excited electrons increases as the optical energy $h\upsilon$ increases. Such an excitation phenomenon generate holes in the depletion layer in the p-region and generates electrons in the depletion layer in the n-region. The holes are accumulated in the p-region while the electrons are accumulated in the n-region. These holes and electrons are the charge generated by the optical energy $h\upsilon$. The amount of the charge is assumed to be denoted by $\Delta q$. At this point in time, the amount of the charge accumulated in the depletion layer capacitance is $(Q1+\Delta q)$.

The objective of the tenth period is to transfer the charge $\Delta q$ accumulated in the diodes 291 constituting the image elements on the first column to the capacitor 298 connected between the input and the output terminals of the inverter 296 and then output the charge as a voltage. In this period, while the switch 297 is open, the switch 293 is closed and the anode of the diode 291 is connected to the constant voltage Va. Though the switch 297 is open, the voltage at the terminal A hardly changes from the bias voltage Vb owing to the negative feedback operation of the inverter 296. Because of the negative feedback operation of the inverter 296, the voltage applied to the diode 291 becomes substantially equal to (Vb−Va), the value of the depletion layer capacitance becomes Cd1 and the accumulated charge returns to Q1. As a result, the charge $\Delta q$ which was accumulated by the optical energy $h\upsilon$ during the preceding periods (i.e., the second to the ninth periods) moves to the capacitor 298.

In this case, since the depletion layer existing in the parasitic diode 292 is shielded from light during the second to the ninth periods, no charge is newly generated in this depletion layer. In addition, since the depletion layer existing in the parasitic diode 295 is also shielded from light, light causes no new charge. Furthermore, since the differential voltage between the two terminals of the parasitic diode 295 hardly changes, the existing charge hardly moves to the capacitor 298.

Consequently, in this tenth period, only the charge $\Delta q$ accumulated in the diode 291 is transferred to the capacitor 298. The transferred charge $\Delta q$ is converted by the capacitance value C2 of the capacitor 298 into a voltage $Vo(=\Delta q/C2$; herein, the voltage gain of the inverter 296 is assumed to be sufficiently large), which is output to the respective output terminals 2911 to 2913.

In this example, a series of operations including the steps of: initializing the charge accumulated in the image elements on the first column; converting the energy of the light incident onto the depletion layer regions into electric charge; transferring the converted charge to the capacitance of the inverter 296; and outputting the charge as a voltage have been described so as to correspond to the subdivided first to tenth periods. On each of the remaining second to fifth columns, the same operations as those performed on the first column are successively performed at the respective timings delayed by a half period of the base clock. In this way, the charge accumulated in the respective image elements is sequentially converted into voltage signals.

Figure 31:
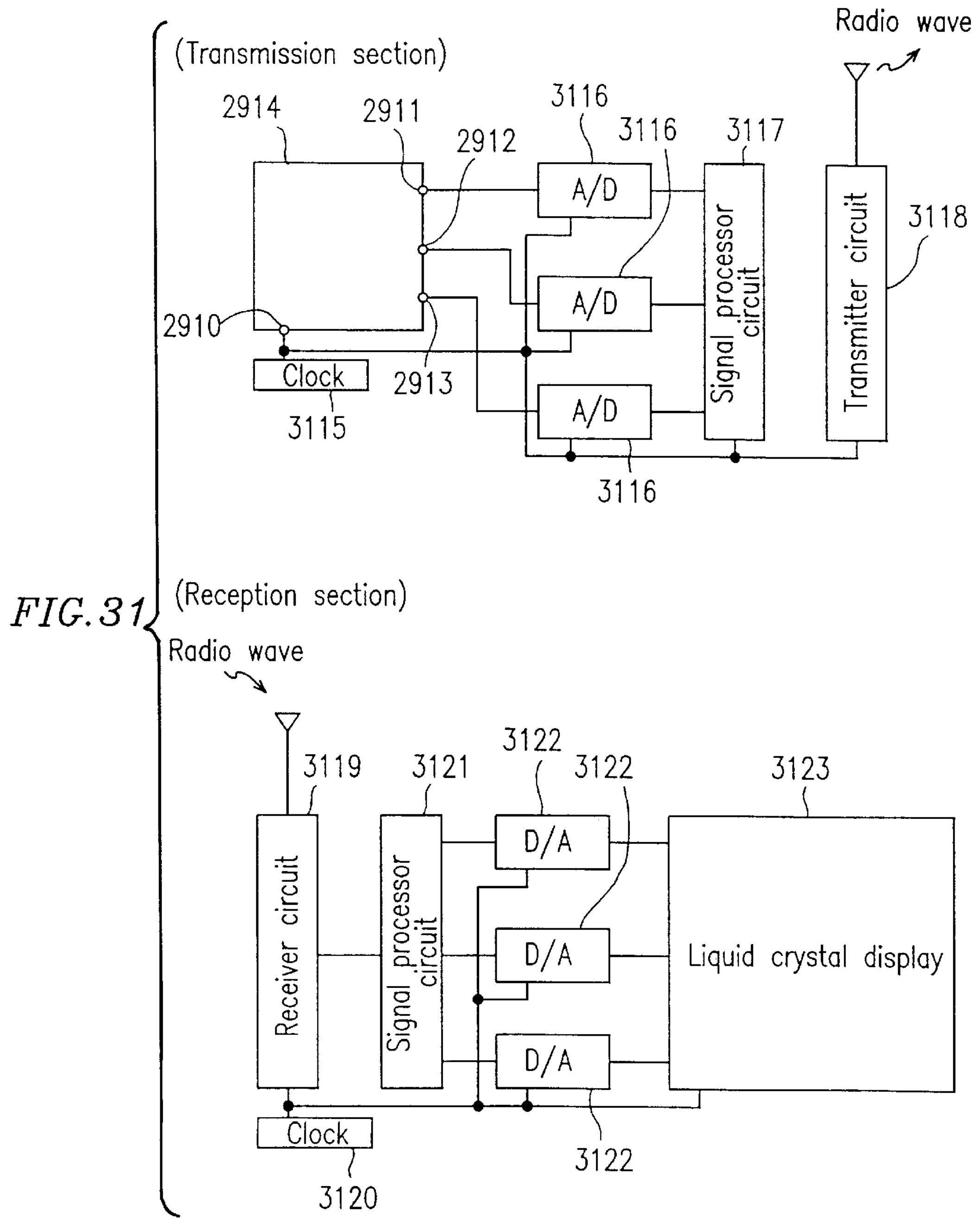
FIG. 31 is a block diagram showing a configuration of a device to which the solid-state imaging element 2914 shown in FIG. 29 has been applied.

The solid-state imaging element 2914 is applicable to a device for converting an image into radio waves so that the image is displayed on an image display device in a remote location. FIG. 31 is a block diagram showing a configuration of a device to which the solid-state imaging element 2914 shown in FIG. 29 has been applied. The device shown in FIG. 31 includes a transmission section for converting an image into radio waves to be transmitted and a reception section for receiving the radio waves and displaying an image. In FIGS. 29 and 31, the components identified by the same reference numerals correspond to each other. In the transmission section, the reference numeral 3115 denotes a clock generator circuit for supplying clock signals required for the respective components of the transmission section; 3116 is an A/D converter for converting continuous electric signals (i.e., so-called "analog signals") output through the output terminals 2911 to 2913 of the imaging element 2914 into discrete electric signals (i.e., so-called "digital signals"); 3117 denotes a signal processor circuit for processing the digital signal converted by the A/D converter 3116 such that the signal has a format facilitating the transmission of the signal as radio waves; and 3118 denotes a transmitter circuit for converting the output signal of the signal processor circuit 3117 into radio waves.

In the reception section, the reference numeral 3120 denotes a clock generator circuit for supplying clock signals required for the respective components of the reception section; 3119 denotes a receiver circuit for receiving the radio waves emitted from the transmitter circuit 3118 of the transmission section; 3121 denotes a signal processor circuit for performing digital signal processing on the signal supplied from the receiver circuit 3119; 3122 denotes a D/A converter circuit for converting the digital output signal of the signal processor circuit 3121 into an analog electric signal; and 3123 denotes a liquid crystal display for displaying an image visible to a man by controlling the reflectance by varying the crystalline structure by means of the analog electric signal.

In the transmission section, the solid-state imaging element 2914 outputs the analog electric signals converted by itself to the terminals 2911 to 2913 corresponding to the respective columns. Each of the analog electric signals output through the terminals 2911 to 2913 is converted by the corresponding A/D converter 3116 provided for the respective terminals into a digital signal to produce image data. The signal processor circuit 3117 receives the converted digital signal and performs digital signal processing on the image data, thereby converting the image data into serial data suitable for transmission. The transmitter circuit 3118 modulates the converted serial data and transmits the data in the form of radio waves.

In the reception section, the receiver circuit 3119 receives the radio waves, amplifies the received signal for obtaining a required voltage and then shapes the waveform thereof. The signal processor circuit 3121 receives the digital output signal output from the receiver circuit 3119 and removes the noise and the distortion, caused in the signal when the signal was transmitted in the form of radio waves, from the received signal by means of digital signal processing. The D/A converter circuit 3122 receives the digital signal output from the signal processor circuit 3121, converts the digital signal into an analog electric signal and drives the liquid crystal display 3123, thereby reproducing the image taken by the imaging element 2914.

In the transmission section, in particular, since the imaging element 2914, the clock generator circuit 3115, the A/D converter 3116 and the signal processor circuit 3117 can be fabricated by a CMOS process, all the circuits except for the transmitter circuit 3118 can be integrally fabricated on one chip. When the CMOS process realizes finer fabrication technologies in the near future, the transmitter circuit 3118 including a radio frequency circuit will also be integrated with the other circuit components on one chip.

In this fourth example, the same effects as those attained by the signal transmission circuit, the signal transmission method and the A/D converter described above can also be attained. That is to say, even when the driving power of an input signal source is small and signal lines to be driven or the like have a large parasitic capacitance, a signal can be transmitted highly efficiently at a high speed.

In the signal transmission circuit and the signal transmission method according to the present invention, an analog signal can be transmitted through a signal line having a large parasitic capacitance with a small driving power and at a higher speed.

In the A/D converter according to the present invention, an analog signal can be converted into a digital signal by means of an amplifier circuit having a small driving power. As a result, the power to be consumed by the A/D converter can be reduced and the area to be occupied by an integrated A/D converter can also be reduced on a semiconductor chip. In addition, since no D/A converter is necessary for the A/D converter of the invention, the power consumption and the chip size can also be reduced because of such a simplified circuit configuration. Furthermore, in the solid-state imaging element of the present invention, similar effects to those attained by the A/D converter of the invention can also be attained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A signal transmission circuit for receiving an input signal and outputting an output signal corresponding to the input signal, comprising:

a first capacitance;

an electric charge supply section for supplying electric charge corresponding to the input signal to the first capacitance;

a second capacitance; and transfer means for transferring the electric charge from the first capacitance to the second capacitance, wherein the second capacitance is larger than the first capacitance; and further comprising conversion means for producing an output signal corresponding to the electric charge which has been transferred to the second capacitance, the conversion means comprising:

an amplifier for amplifying a signal at an input terminal and outputting the amplified signal to an output terminal; and a capacitance connected to the input terminal and the output terminal.

2. A signal transmission circuit according to claim 1, wherein the first capacitance has a first terminal and a second terminal, the second capacitance has a first terminal and a second terminal, the transfer means is a switch for changing a connection state between the first terminal of the first capacitance and the first terminal of the second capacitance, and the second terminal of the first capacitance is connected to the second terminal of the second capacitance.

3. A signal transmission circuit according to claim 2, wherein the electric charge supply section has a driver amp.

4. A signal transmission circuit according to claim 2, wherein the electric charge supply section has a semiconductor device for generating electric charge upon an irradiation of light.

5. A signal transmission method for receiving an input signal and outputting an output signal corresponding to the input signal, comprising:

an accumulation step of accumulating electric charge corresponding to the input signal in a first capacitance;

a transfer step of transferring the accumulated electric charge from the first capacitance to a second capacitance which is larger than the first capacitance; and a conversion step of producing an output signal corresponding to the electric charge which has been transferred to the second capacitance, the conversion step using an amplifier for amplifying a signal at an input terminal and outputting the amplified signal to an output terminal and a capacitance connected to the input terminal and the output terminal.

6. A signal transmission method according to claim 5, wherein the transfer step and the conversion step are performed simultaneously.

7. A solid-state imaging element for receiving incident light and outputting an output signal corresponding to the incident light, comprising:

a first capacitance;

an electric charge supply section for supplying electric charge corresponding to the incident light to the first capacitance;

a second capacitance; and transfer means for transferring the electric charge from the first capacitance to the second capacitance, wherein the second capacitance is larger than the first capacitance; and further comprising conversion means for producing an output signal corresponding to the electric charge which has been transferred to the second capacitance, the conversion means comprising:

an amplifier for amplifying a signal at an input terminal and outputting the amplified signal to an output terminal; and a capacitance connected to the input terminal and the output terminal.

8. A solid-state imaging element according to claim 7, wherein the electric charge supply station is a photodiode and the first capacitance is a parasitic capacitance of the photodiode.

9. An A/D converter for receiving an input voltage and outputting a digital signal corresponding to the input voltage, comprising:

a first amplifier circuit for amplifying a voltage corresponding to a difference between the input voltage and a reference voltage;

a holding capacitance for holding a voltage output from the first amplifier circuit;

a second amplifier circuit for amplifying the voltage held in the holding capacitance;

a parasitic capacitance caused by a wiring connecting the first amplifier circuit to the second amplifier circuit;

a first switch provided between the first amplifier circuit and the holding capacitance; and a second switch provided between the holding capacitance and the parasitic capacitance, wherein the parasitic capacitance is larger than the holding capacitance, and in a first state, the first switch is ON and the second switch is OFF, while in a second state, the first switch is OFF and the second switch is ON.

* * * * *

UNITED STATES PATENT AND TRADEMARK OFFICE

CERTIFICATE OF CORRECTION

PATENT NO. : 6,025,794
DATED : February 15, 2000
INVENTOR(S) : Keiichi Kusumoto, et al.

It is certified that error appears in the above-identified patent and that said Letters Patent is hereby corrected as shown below:

On the Title page, add to item [56]:

FOREIGN PATENT OR PUBLISHED FOREIGN PATENT APPLICATION

| | | DOCUMENT NUMBER | | | | | | | PUBLICATION DATE | COUNTRY OR PATENT OFFICE | CLASS | SUBCLASS | TRANSLATION | |
|---|---|---|---|---|---|---|---|---|---|---|---|---|---|---|
| | | | | | | | | | | | | | YES | NO |
| | | 3 | 2 | 1 | 4 | 8 | 1 | 6 | 9/20/91 | JP | | | Partial | |
| | | 60 | 0 | 2 | 9 | 0 | 2 | 9 | 2/14/85 | JP | | | Partial | |

Signed and Sealed this

Eleventh Day of July, 2000

Attest:

Q. TODD DICKINSON

*Attesting Officer*

*Director of Patents and Trademarks*